(12) United States Patent
Tangyunyong et al.

(10) Patent No.: US 10,145,894 B1
(45) Date of Patent: Dec. 4, 2018

(54) DEFECT SCREENING METHOD FOR ELECTRONIC CIRCUITS AND CIRCUIT COMPONENTS USING POWER SPECTRUM ANAYLYSIS

(71) Applicant: National Technology & Engineering Solutions of Sandia, LLC, Albuquerque, NM (US)

(72) Inventors: Paiboon Tangyunyong, Albuquerque, NM (US); Joshua Beutler, Albuquerque, NM (US); Edward I. Cole, Jr., Albuquerque, NM (US); Guillermo M. Loubriel, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 359 days.

(21) Appl. No.: 14/882,710

(22) Filed: Oct. 14, 2015

Related U.S. Application Data

(63) Continuation-in-part of application No. 13/309,281, filed on Dec. 1, 2011, now Pat. No. 9,188,622.

(51) Int. Cl.
*G01R 31/28* (2006.01)
*G01R 27/28* (2006.01)

(52) U.S. Cl.
CPC ......... *G01R 31/2894* (2013.01); *G01R 27/28* (2013.01)

(58) Field of Classification Search
CPC ........................... G01R 31/2994; G01R 27/28

USPC .................................................... 324/762.03
See application file for complete search history.

(56) References Cited

U.S. PATENT DOCUMENTS

| | | | |
|---|---|---|---|
| 5,430,305 A | 7/1995 | Edward et al. | |
| 5,949,798 A | 9/1999 | Sakaguchi | |
| 6,058,502 A * | 5/2000 | Sakaguchi | ......... G01R 31/3004 713/340 |
| 6,078,183 A | 6/2000 | Edward | |
| 6,549,022 B1 | 4/2003 | Edward et al. | |
| 6,600,333 B1 | 7/2003 | Martin et al. | |
| 6,671,153 B1 | 12/2003 | Ker et al. | |
| 2001/0043079 A1 | 11/2001 | Sakaguchi | |
| 2003/0016044 A1 | 1/2003 | Ishida et al. | |

(Continued)

OTHER PUBLICATIONS

Carson, et al., "Algorithm Explorer: Visualizing Algorithms in a 3D Multimedia Environment", ACM SIGCSE, vol. 39, No. 1, Mar. 7, 2007, 5 pages.

(Continued)

*Primary Examiner* — Jeff W Natalini
(74) *Attorney, Agent, or Firm* — Martin I. Finston

(57) ABSTRACT

A method involving the non-destructive testing of a sample electrical or electronic device is provided. The method includes measuring a power spectrum of the device and performing a Principal Component Analysis on the power spectrum, thereby to obtain a set of principal components of the power spectrum. The method further includes selecting a subset consisting of some of the principal components, and comparing the subset to stored reference data that include representations in terms of principal components of one or more reference populations of devices. Based at least partly on the comparison, the sample device is classified relative to the reference populations.

18 Claims, 23 Drawing Sheets

(56) References Cited

U.S. PATENT DOCUMENTS

2010/0292571 A1* 11/2010 Kim .................. A61B 5/02007
600/438
2014/0039664 A1* 2/2014 Anemikos .......... G01R 31/2894
700/121

OTHER PUBLICATIONS

Malloy, et al., "Exploiting UML Dynamic Object Modeling for the Visualization of C++ Programs", Proceedings of the 2005 ACM Symposium on Software Visualization, ACM, 2005, pp. 105-114.
Shah, et al., "Visualization of Exception Handling Constructs to Support Program Understanding", Proceedings of the 4th ACM Symposium on Software Visualization, ACM, Sep. 16, 2008, pp. 19-28.
Maletic, et al., "MosaiCode: Visualizing Large Scale Software a Tool Demonstration", 2011 6th IEEE International Conference on Visualizing Software for Understanding and Analysis, 2011, 4 pages.
Davies, et al., "Back to basics: the principles of principal component analysis", 2004, Spectroscopy Europe, pp. 20-23.
Smith, L. I., A tutorial on Principal Components Analysis, 2002.
Jeong, D. H. et al., "Understanding Principal Component Analysis Using a Visual Analytics Tool", 2009, Charlotte Visualization Center, UNC Charlotte.

* cited by examiner

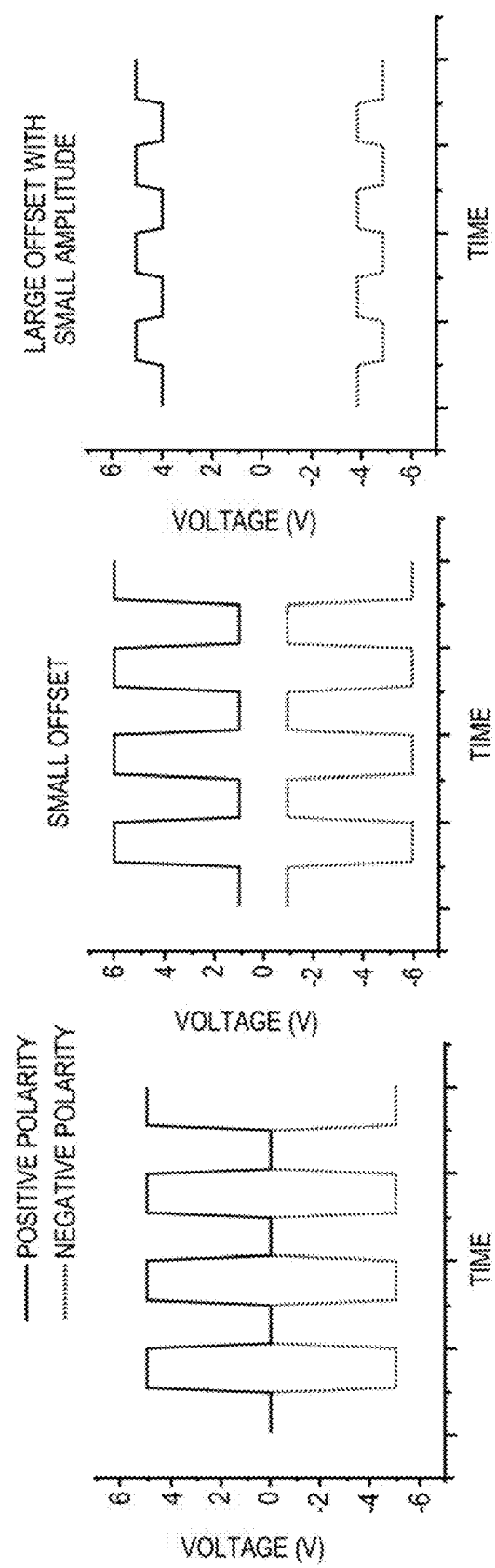

DEFECT SCREENING METHOD FOR ELECTRONIC CIRCUITS AND CIRCUIT COMPONENTS USING POWER SPECTRUM ANAYLYSIS

CROSS-REFERENCE TO RELATED APPLICATIONS

This application is a continuation-in-part of U.S. patent application Ser. No. 13/309,281, which was filed on Dec. 1, 2011 by Paiboon Tangyunyong under the title "Power Spectrum Analysis for Defect Screening in Integrated Circuit Devices", which is commonly owned herewith, and the entirety of which is hereby incorporated herein by reference.

FEDERALLY SPONSORED RESEARCH

The United States Government has rights in this invention pursuant to Department of Energy Contract No. DE-AC04-94AL85000 with Sandia Corporation.

FIELD OF THE INVENTION

Device testing; and in particular, the use of power spectra for defect screening in integrated circuit devices.

ART BACKGROUND

An integrated circuit (IC) can have millions of transistors with a feature size less than a micrometer. Therefore, to identify a defect in an IC generally requires extensive failure analysis. In the past, various techniques based on electrical, optical, and thermal properties of ICs have been developed. However, these techniques are quite complex, time-consuming, and costly.

Further, an IC can contain a latent defect (also referred to as a "failure precursor") that is likely to develop into a defect after a period of use. Conventionally, these latent defects are detected by subjecting the IC to reliability testing, during which the device receives high voltage and/or high temperature for a period of time. Reliability testing can be quite time-consuming and can significantly increase the production cost.

Therefore, there is a need for a simple and efficient technique for screening ICs to identify the existence of defects.

SUMMARY OF THE INVENTION

In a herein-disclosed method for defect screening in an IC or other circuit element, a time-varying signal is supplied to a device sample. The power spectrum of the device sample is measured at one of the pins of the device sample. A defect in the device sample can be identified by comparing the power spectrum with one or more power spectra of the device that have a known defect status.

In a herein-disclosed system for defect screening of integrated circuit devices, a signal generator supplies a time-varying signal to a device sample. A spectrum analyzer measures a power spectrum at one of the pins of the device sample. A computer system identifies an indication of a defect in the device sample based on results of comparing the power spectrum with one or more power spectra of the device that have a known defect status.

In one aspect, the present invention is a method involving non-destructive testing of a sample device having a specified function in the context of electronic circuitry. The method comprises applying at least one stimulus to the sample device, wherein the stimulus is a time-varying electrical signal applied to one or more pins of the device; and measuring at least one power spectrum at a selected pin of the sample device, wherein the measured power spectrum represents a response of the sample device to a stimulus, and wherein the power spectrum is taken over a multiplicity n of spectral bins.

The method further comprises performing a Principal Component Analysis (PCA) on the power spectrum, thereby to obtain a set of principal components of the power spectrum; selecting at least one subset of the set of principal components, wherein the subset consists of fewer than n of the principal components; and comparing the subset to stored reference data, thereby to obtain a comparison result. The stored reference data include representations in terms of principal components of one or more reference populations of devices having the same specified function as the sample device.

The method further comprises classifying the sample device relative to reference populations, wherein the classification is based at least in part on the comparison result.

BRIEF DESCRIPTION OF THE DRAWINGS

FIGS. 3A-3C illustrate examples of a periodic waveform that supplies a ripple voltage to a device sample.

FIG. 10 provides a three-axis PCA-PSA analysis of a batch of ASICs before and after burn-in.

Figure 15:
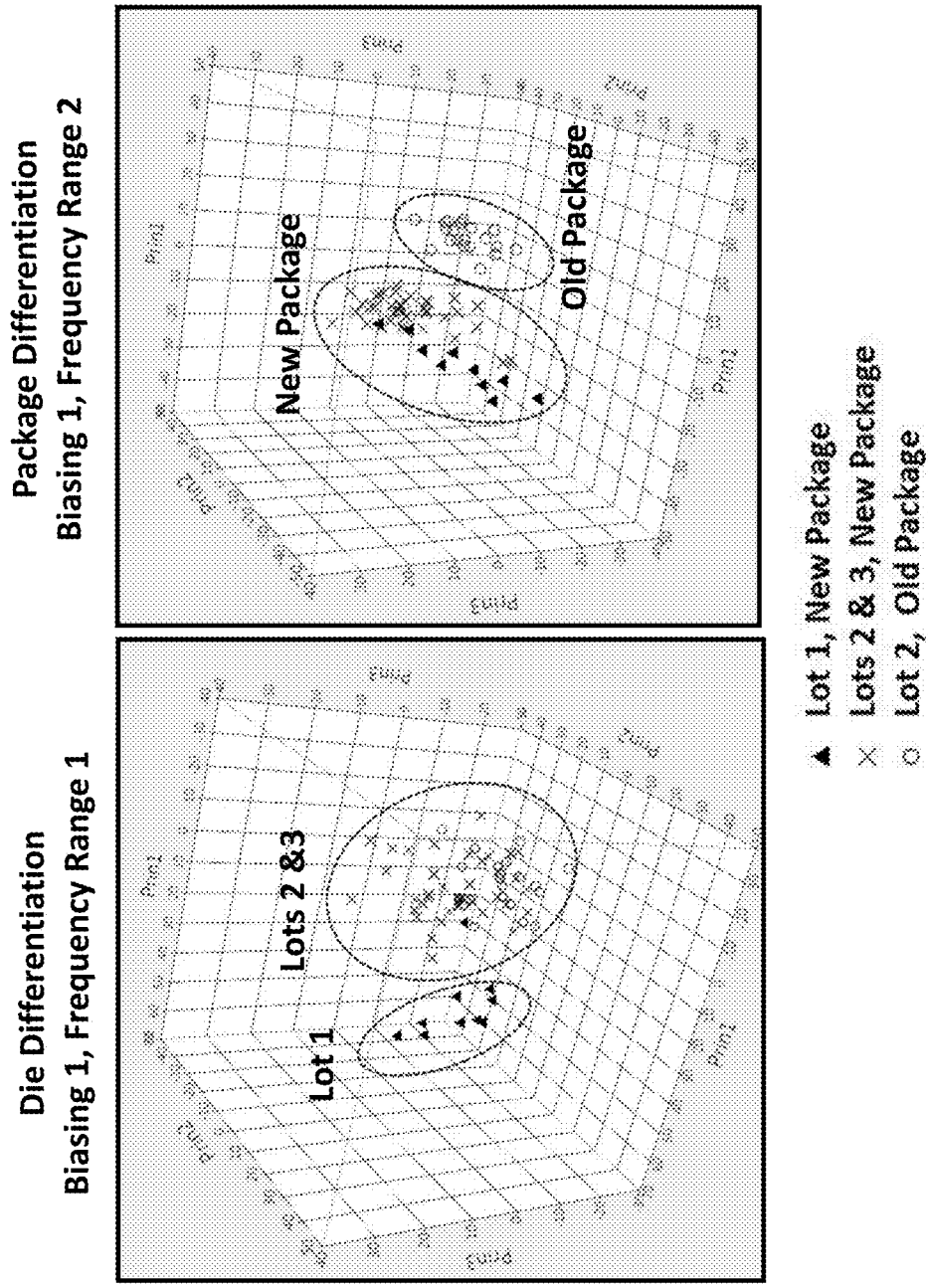
FIGS. 15-17 provide a three-axis PCA-PSA analysis of a batch of complex ASICs. The ASICs were provided in three different lots, denominated Lot 1, Lot 2, and Lot 3. Lots 2 and 3 had similar processing parameters on the device die, but the processing parameters for Lot 1 were slightly different. Within each lot, there were two different package types, denominated "old" and "new".

The Principal Component selection of FIG. 15 is PC1, PC2, PC3. The left-hand scatterplot and the right-hand scatterplot of FIG. 15 represent the same biasing conditions, denominated Biasing 1, but with the PSA spectra taken over different frequency ranges, denominated Frequency Range 1 and Frequency Range 2.

Figure 16:
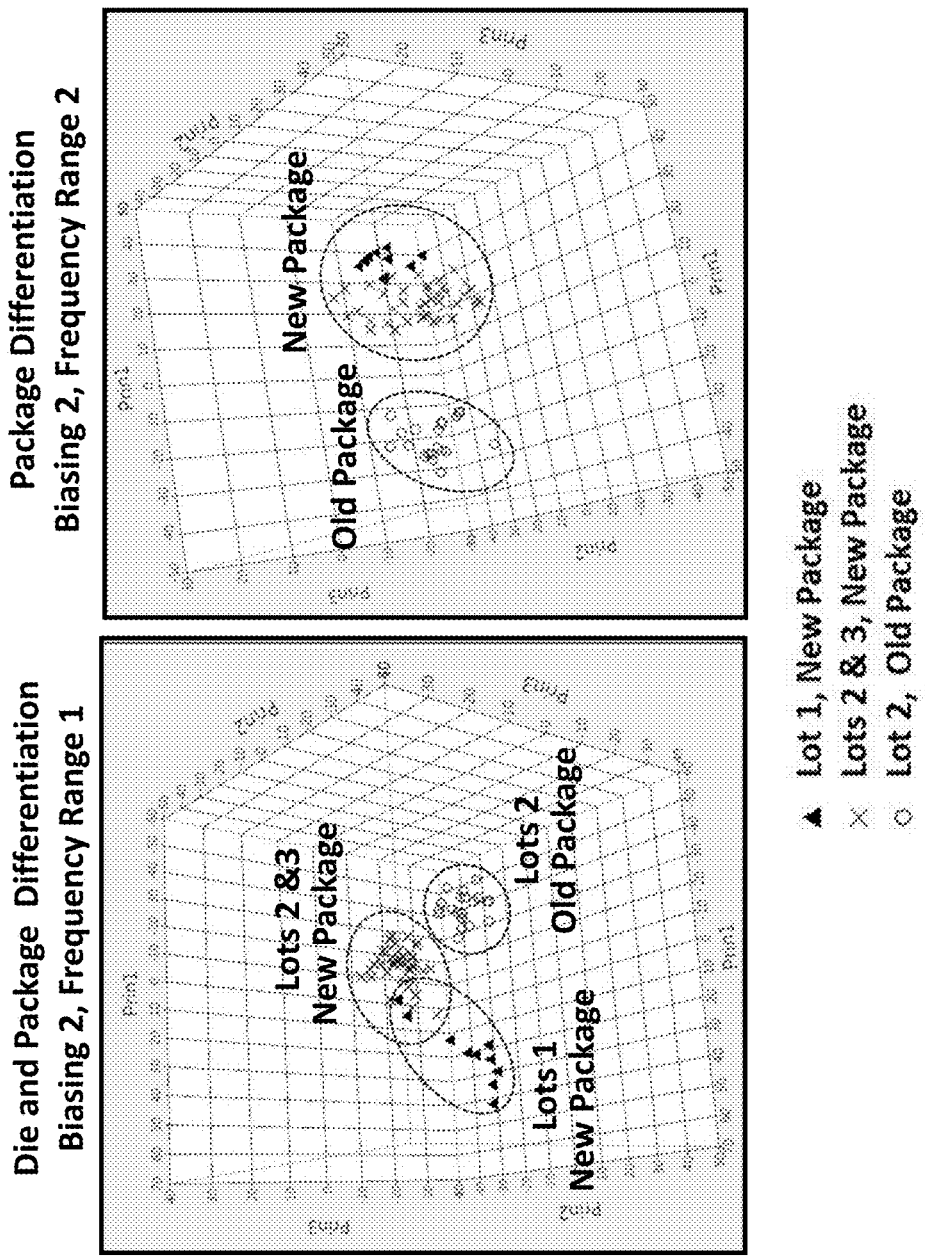

The Principal Component selection of FIG. 16 is PC1, PC2, PC3. The left-hand scatterplot and the right-hand scatterplot of FIG. 16 represent the same biasing conditions, denominated Biasing 2. As in the previous figure, the left-hand plot represents Frequency Range 1, and the right-hand plot represents Frequency Range 2.

Figure 17:
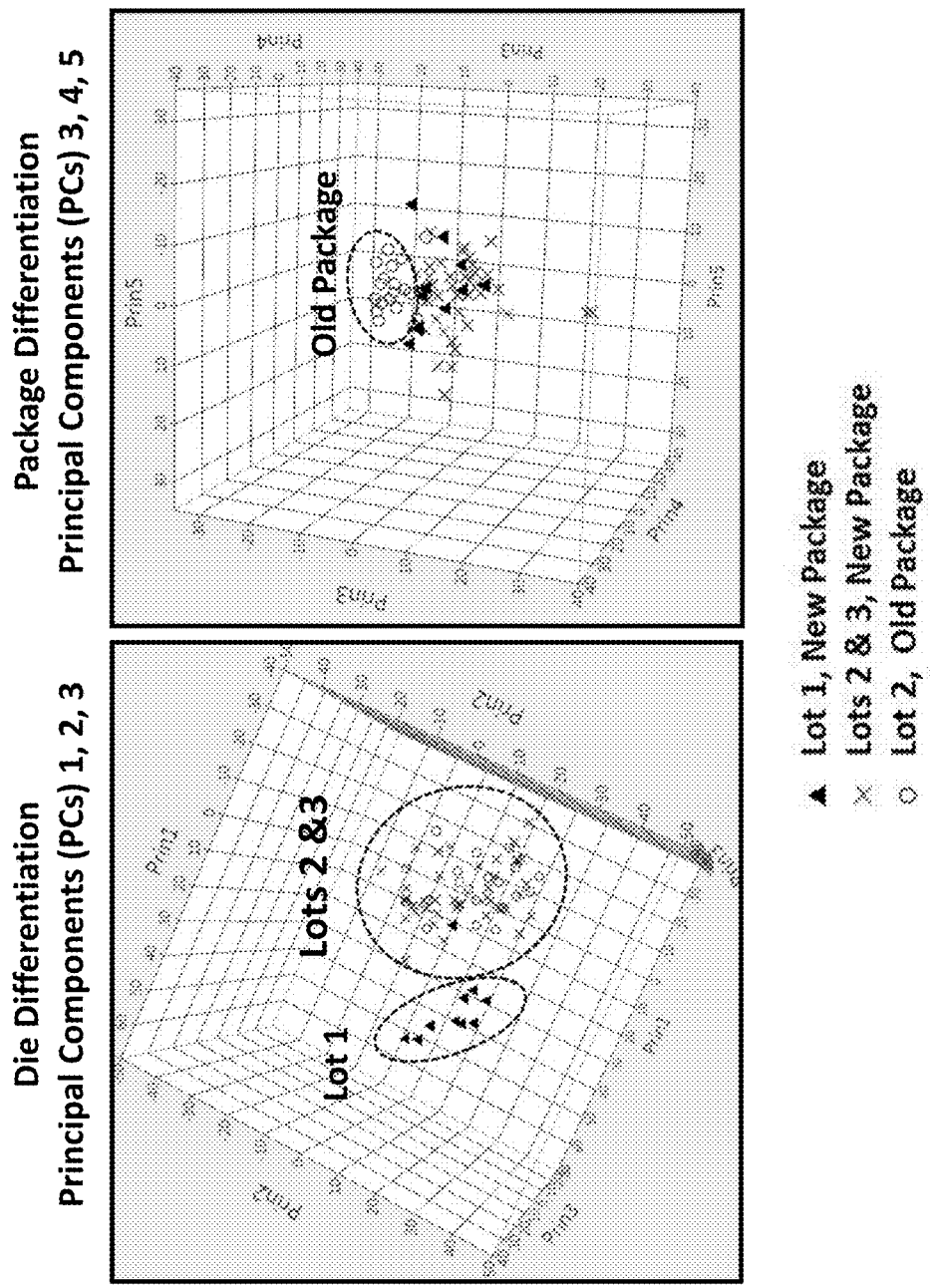

FIG. 17 displays data resulting only from Biasing 1 and Frequency Range 1. However, the Principal Component selection of the left-hand scatterplot is PC1, PC2, PC3, whereas for the right-hand scatterplot it is PC3. PC4, and PC5.

Figure 18:
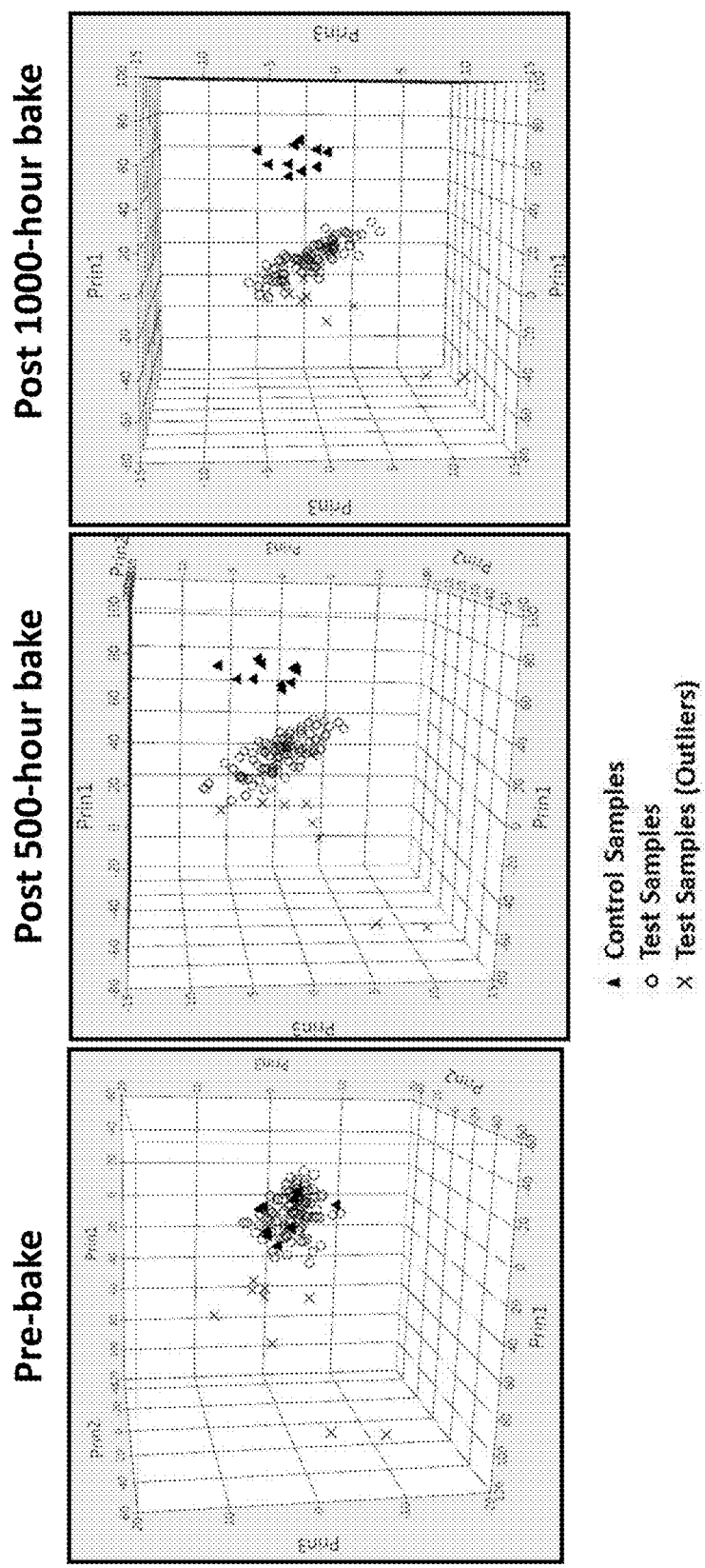

FIG. 18 provides an example PCA-PSA analysis of a sample population of heat-treated Zener diodes. The figure displays three-dimensional PCA-PSA scatterplots for, respectively, unbaked samples, 500-hour baked samples, and 1000-hour baked samples.

Figure 19:
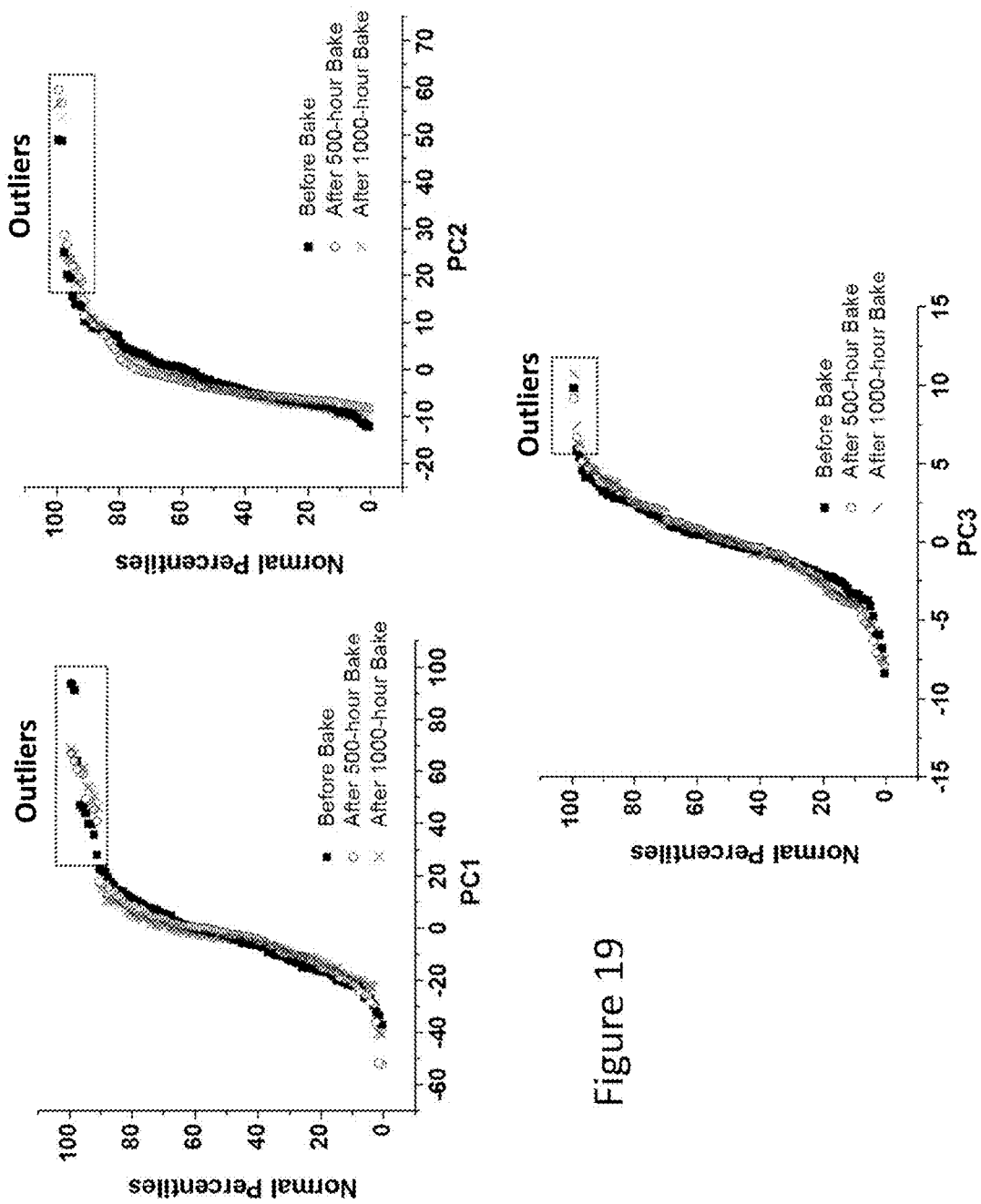

FIG. 19 displays the Cumulative Distribution Functions (CDFs) of, respectively, PC1, PC2, and PC3 of the pre-bake, 500-hour bake, and 1000-hour bake populations of FIG. 18.

Figure 20:
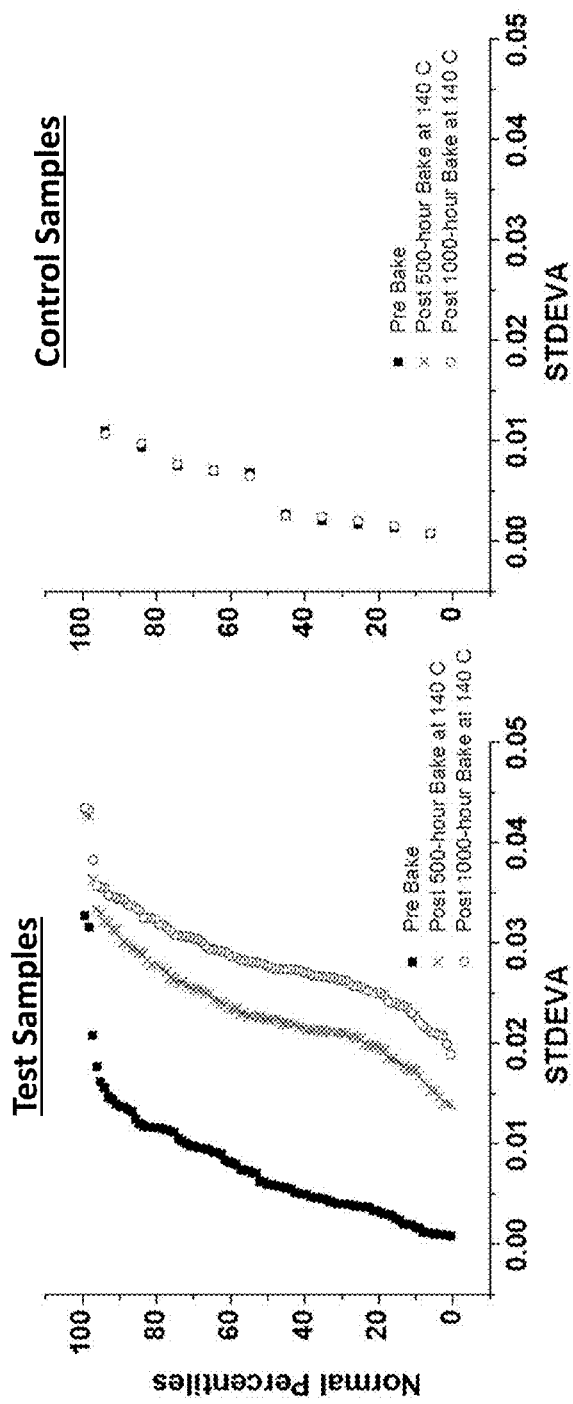

FIG. 20 displays the CDFs of the standard deviations of, respectively, the test sample PSA spectra and the control sample PSA spectra of the sample population of FIG. 18. CDFs are provided for, respectively, the pre-bake, 500-hour bake, and 1000-hour bake samples.

Figure 21:
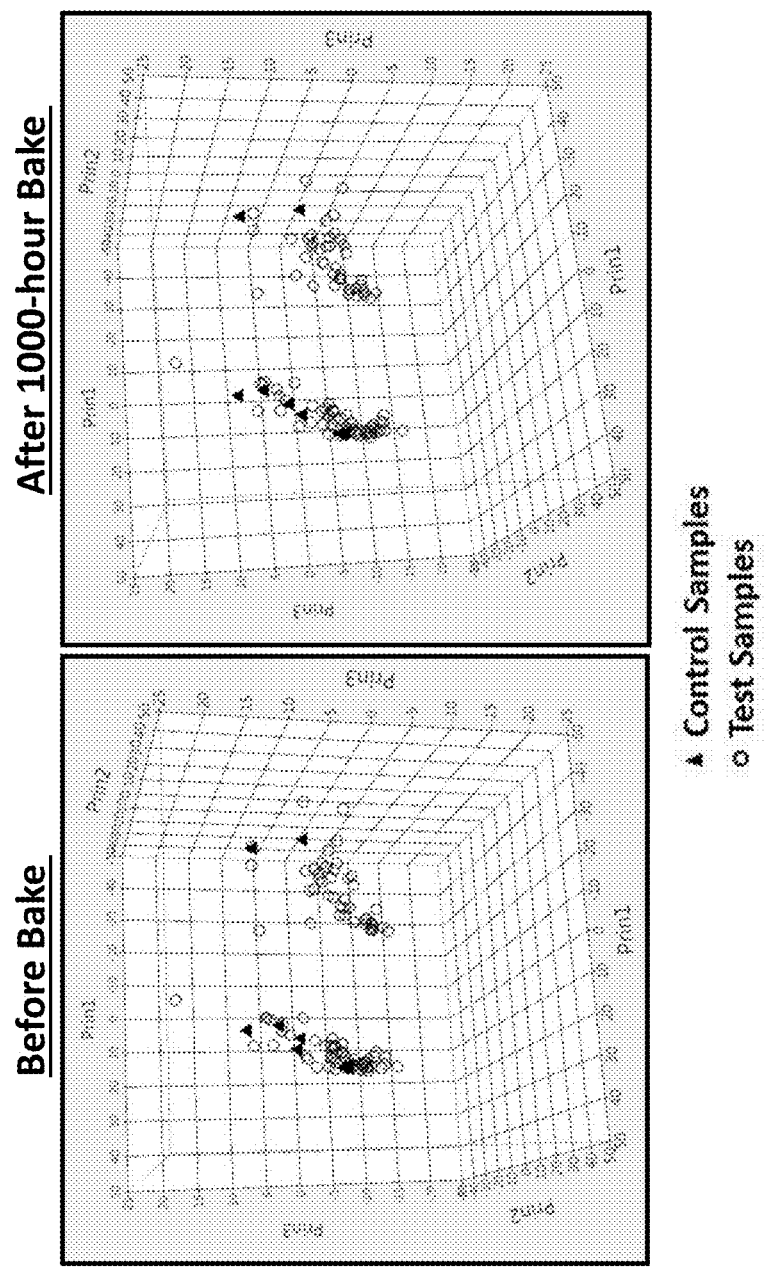

FIG. 21 displays a three-dimensional PCA-PSA scatterplot of a population of high-voltage diodes that were either control samples or test samples that were baked without bias for a total of 1000 hours at 140° C. The left-hand scatterplot displays the pre-bake data, and the right-hand scatterplot displays the post-bake data (in which the control samples are included for reference).

Figure 22:
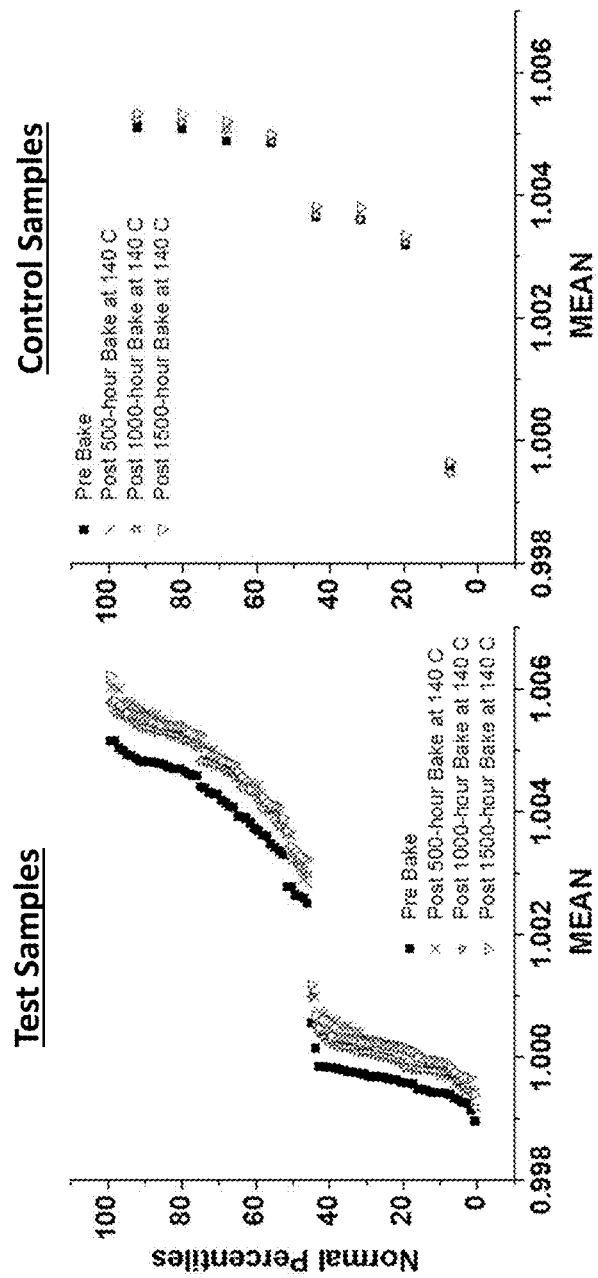

FIG. 22 displays, in the left-hand scatterplot, the CDFs of the test samples of FIG. 21, specifically the respective pre-bake and 500-hour, 1000-hour, and 1500-hour baked samples. The right-hand scatterplot displays the CDFs of (unbaked) samples selected as control samples for, respectively, the pre-bake population and the populations baked for 500, 1000, and 1500 total hours.

Figure 23:
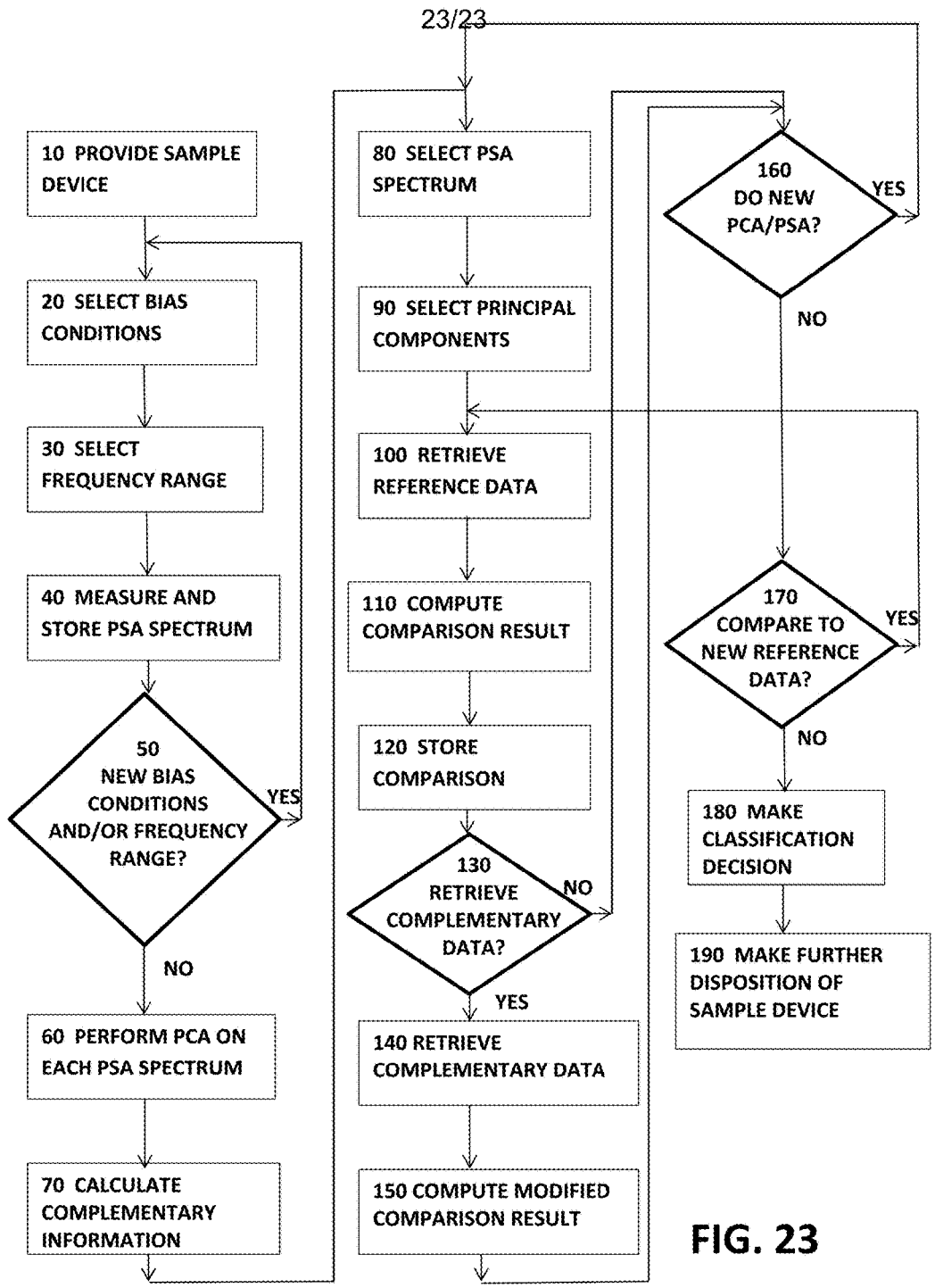

FIG. 23 is a flowchart illustrating a non-limiting example process using PCA-PSA techniques.

DETAILED DESCRIPTION

Power spectrum analysis (PSA) is a technique that indirectly measures the frequency response of a device when the device is subject to a dynamic stimulus. Devices with defects will have different frequency response than the devices with no defects. Conventional failure analysis techniques are effective only when defects produce an observable failure in a device with its electrical signatures (e.g. current leakage or functionality) different from a "normal" device. With increasing complexity of modern devices, the electrical signatures of latent defects (also referred to "precursors") can be masked by the background electrical signals of normal operation, making detection of these defects extremely difficult. PSA has the potential to be more sensitive than conventional detection schemes and allows detection of latent defects (precursors). Latent defects have no other observable failure signatures, but can eventually cause failures after a period of normal operation and in some cases during storage. Latent defects can potentially pose a major reliability risk.

Embodiments of the invention utilize the power spectrum of an integrated circuit device (equivalently, "device") for detecting the existence of defects in the device. The power spectrum is measured while the device is receiving a dynamic stimulus. According to embodiments of the invention, the measured power spectrum indicates the existence of a defect and, in some scenarios, a specific type of defect. Therefore, the measured power spectrum can be used as a signature of the device for screening defects in the device. In the following description, the terms "power spectrum," "signature" and "power spectrum analysis (PSA) signature" are used interchangeably.

Embodiments of the invention provide a simple and efficient technique for screening defects in devices. In some embodiments, the defect screening technique compares the power spectra of two samples of the same device to determine whether a defect exists. For example, the power spectrum of a first device sample can be compared with the power spectrum of a second device sample that has a known defect status. A device sample has a "known defect status" means that the device sample either has no defect or has a known type of defect. Similarly, a power spectrum has a "known defect status" means that the power spectrum is generated from a device sample that either has no defect or has a known type of defect. If the second device sample has no defect, the differences between the power spectra of the first device sample and the second device sample indicate that the first device sample likely has some type of defect. In some embodiments, the defect screening technique establishes a database that contains the power spectra of devices with known defect status. The defect screening technique can derive rules from the features of these power spectra, and identify the existence of a defect or a known type of defect in a given device sample based on these rules.

The PSA spectra of devices with known defect status can be measured experimentally from physical device samples or generated from modeled device samples based on first principles with theoretical modeling. For example, a device can be modeled as a combination of resistors, capacitors and inductors. The power spectrum (i.e., the PSA signature) of the device in response to a given dynamic stimulus can be calculated (or simulated) based on known principles. The resulting PSA signatures, also referred to as model-generated PSA signatures, allow screening of defects in device samples, without requiring comparison to reference devices with a known defect status and the need of having a library of measured PSA signatures.

Figure 1:
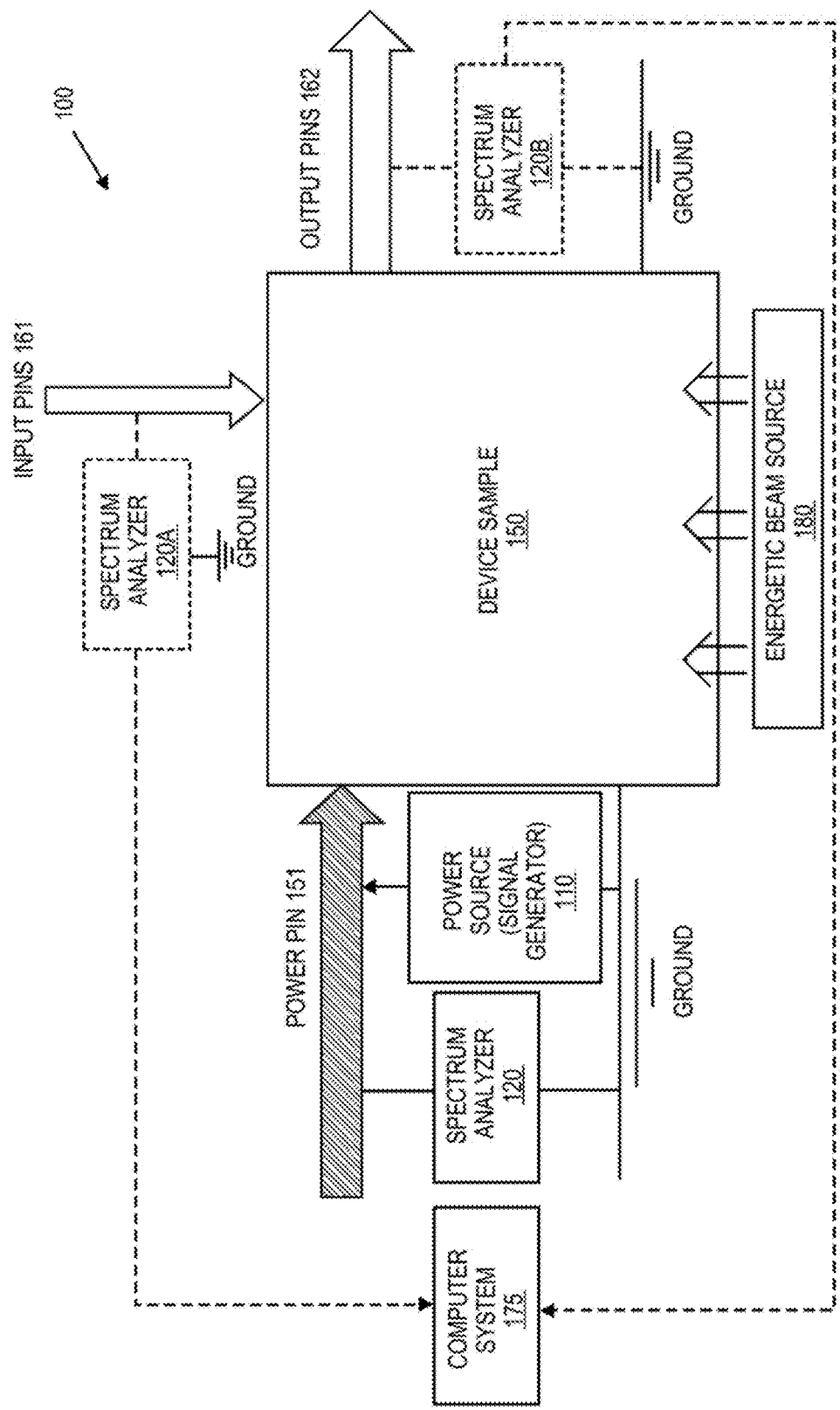
FIG. 1 is a block diagram illustrating an embodiment of a system that measures a power spectrum analysis (PSA) signature for a device sample.

FIG. 1 is a block diagram illustrating a first embodiment of a system 100 for power spectrum analysis (PSA) measurement. In this embodiment, system 100 includes a power source 110 and a spectrum analyzer 120 coupled between a power pin 151 and the ground of a sample of a device (also referred to as "device sample" 150). In one embodiment, device sample 150 is a sample of an integrated circuit device. Device sample 150 can be in wafer form (i.e., with multiple other samples of the device on a common semiconductor substrate), in die form (i.e., separated from the wafer but not yet packaged), or in packaged form.

In the embodiment of FIG. 1, power source 110 is a signal generator that provides a dynamic (i.e., time-varying) stimulus to device sample 150 through its power pin 151. In one embodiment, the input to spectrum analyzer 120 is the same dynamic stimulus that feeds into power pin 151. The dynamic stimulus can be a periodic waveform of ripple voltage, such as sine-wave, square wave, chirp, or the like. As will be shown in the example of FIGS. 4A-4C, the waveform (as well as the power spectrum) of the ripple voltage measured at power pin 151 can change after power source 110 is connected to device sample 150.

Device sample 150 also has input pins 161 (including data inputs, clock inputs pins, test inputs such as Joint Test Action Group (JTAG) inputs, and any other input pins) and output pins 162. It is appreciated that the term "pins" herein is used equivalently to "lines," "wires," or "ports," and does not mean or imply that device sample 150 has a particular form (such as in wafer, die, or packaged form). Input pins 161 can be connected to the same signal source or different signal sources. Each input pin 161 can be floating (i.e., no voltage applied), biased with a constant voltage, or set to the same varying voltage as power pin 151. Input pins 161 may also be biased independently of the power pin 151. Some of the input pins, such as the one or more clock pins, can be biased with a switching voltage (e.g., a square wave) to maintain a known dynamic state. Each of output pins 162 can be left floating, or coupled with a load resistor as specified by the manufacturer.

In the embodiment of FIG. 1, when a dynamic stimulus is applied to power pin 151 of device sample 150, spectrum analyzer 120 measures its electrical response (which is a time-varying voltage signal). Specifically, spectrum analyzer 120 measures the response on power pin 151, calculates the real-time Fast Fourier Transform (FFT) of the response, and displays the frequency components (i.e., power spectrum) of the response. The display shows the amplitude of each frequency component. The amplitude can be shown in decibels (in log scale) such that non-dominant frequency components can be visible on the display. The power spectrum is a PSA signature of device sample 150.

In alternative embodiments, spectrum analyzer 120 can be connected to any of input pins 161 (including the one or more clock pins) or any of output pins 162 to measure the response of device sample 150 to the dynamic stimulus provided through power pin 151. These alternative placements of spectrum analyzer 120 are shown in FIG. 1 as spectrum analyzer 120A and spectrum analyzer 120B in dotted text boxes, and their connections to other components are shown in dotted lines. Each of these alternative placements of spectrum analyzer 120, 120A and 120B can produce the same or different PSA signatures of device sample 150 for defect screening purposes.

Figure 2:
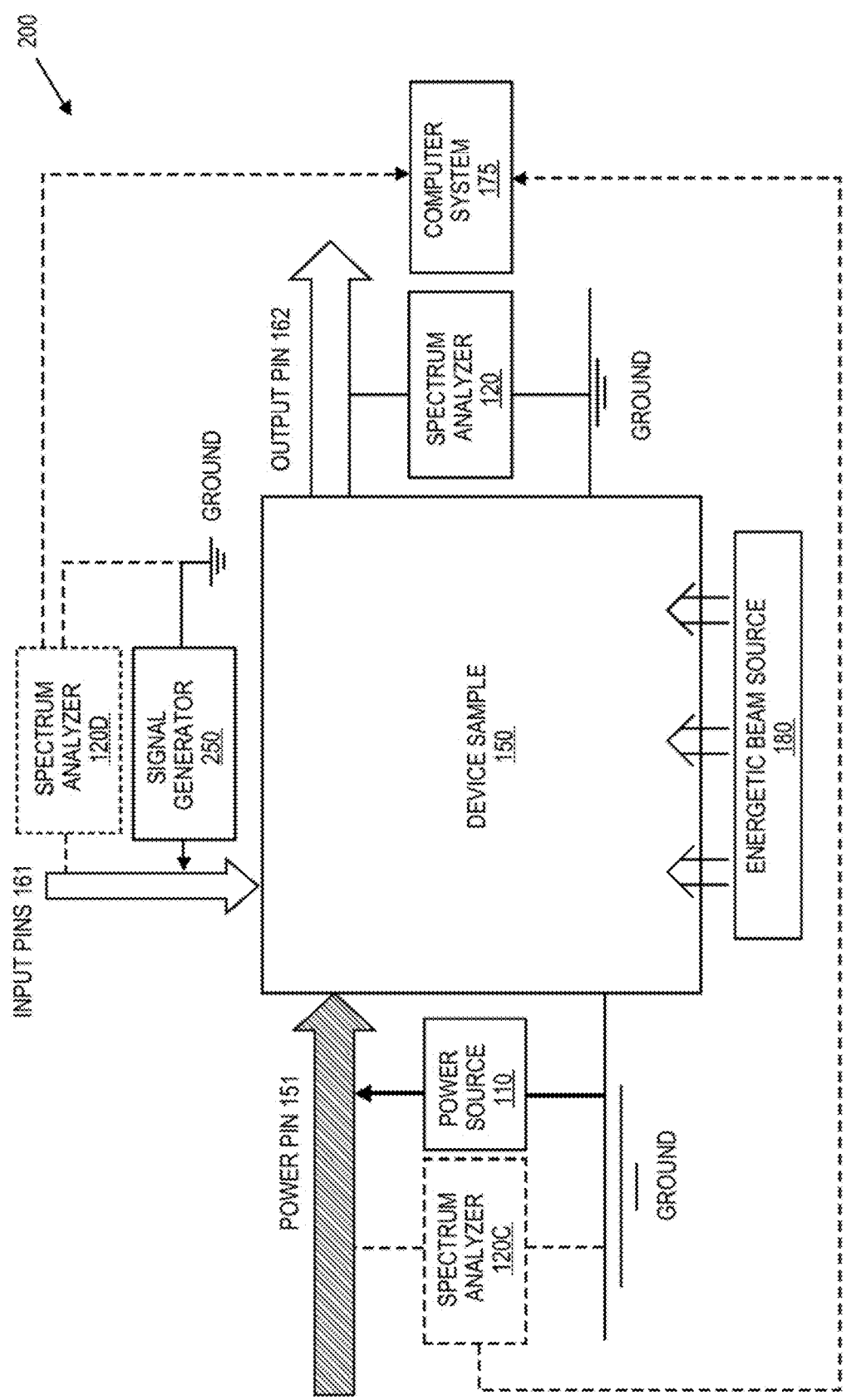
FIG. 2 is a block diagram illustrating another embodiment of a system that measures a PSA signature for a device sample.

FIG. 2 is a block diagram illustrating a second embodiment of a system 200 for power spectrum analysis (PSA) measurement. In this embodiment, the dynamic stimulus is provided to device sample 150 through at least one of input pins 161. Power source 110 provides voltage, normally constant voltage, to power pin 151, and at least one input pin 161 receives a dynamic stimulus from a signal generator 250. The dynamic stimulus can be a time-varying sequence of voltages (e.g., sine wave, square wave, or a sequence of logical lows and highs). The rest of input pin 161 can be either floating, biased with a constant voltage, or biased with a switching voltage to maintain a known dynamic biasing state. In some embodiments, signal generator 250 may be a vector generator that is coupled to multiple input pins 161 to supply the dynamic stimulus in the form of a sequence of test vectors (with each test vector being a vector of logical lows and highs). These test vectors can also be used for functional testing of device sample 150; that is, the test vectors can also be used to verify whether device sample 150 produces outputs in response to inputs as required by its manufacturer's specification.

As shown in FIG. 2, spectrum analyzer 120 can be coupled between any of output pins 162 and the ground to measure the response of device sample 150 to the dynamic stimulus injected into the one or more input pins 161. The measured response is also a PSA signature of device sample 150. In some embodiments, the dynamic stimulus can be provided to a combination of power pin 151 and one or more input pins 161, and spectrum analyzer 120 can measure the response via any of output pins 162 to obtain a PSA signature.

In alternative embodiments, spectrum analyzer 120 can be connected to power pin 151 or any of input pins 161 to measure the response of device sample 150 to the dynamic stimulus provided through the one or more input pins 161. These alternative placements of spectrum analyzer 120 are shown in FIG. 2 as spectrum analyzer 120C and spectrum analyzer 120D in dotted text boxes, and their connections to other components are shown in dotted lines. Each of these alternative placements of spectrum analyzer 120, 120C and 120D can produce the same or different PSA signatures of device sample 150 for defect screening purposes.

In the embodiments of FIG. 1 and FIG. 2, spectrum analyzer 120 (or any of spectrum analyzers 120A-D) is connected to a computer system 175. Computer system 175 can be a computer (e.g., a server, a workstation, a desktop, a laptop, or other computing devices) or other data processing devices. In one embodiment, computer system 175 receives PSA signatures of device samples and stores them in data storage with their associated defect status, such as defect or no defect, the type of defect (e.g., short circuit, open circuit, etc.), location of the defect, and the like. In one embodiment, the defect status can be obtained by performing a reliability test and/or other failure analysis on the device samples to see if any of them fails and the reason of failure. In one embodiment, the stored PSA signatures can be measured experimentally, generated based on theoretical modeling, or a combination of both. Based on the stored information, computer system 175 can determine whether a given device sample is defective or is likely to fail by correlating or comparing the PSA signature of the given device sample with the stored PSA signatures.

In some embodiments as shown in FIG. 1 and FIG. 2, device sample 150 can be exposed to an energetic beam source 180, which generates laser (photons), X-ray, ion beams or electron beams. These energetic beams enhance a device's PSA signature with respect to the peak locations, amplitudes, shapes and other distinctive properties of the power spectrum. As described above, PSA signatures can be used to differentiate a defective device sample from its non-defective counterparts, and among device samples having different types of defects. In some scenarios, the PSA signatures of these device samples may be quite similar and difficult to differentiate. The energetic beams can significantly enhance the differences between the PSA signatures of these devices. For example, a defective device sample can have more/less peak locations, higher/lower peak amplitudes, and/or different shapes than non-defective device samples. In some embodiments, the energetic beams can be used to accelerate the formation of defects if latent defects are hidden in a device sample. The energetic beams can be focused beams or flat (non-focused) beams, and can be applied to the device front side (device side) or the backside (substrate side) as long as there is sufficient energy and/or appropriate wavelength to penetrate the device layer. It is appreciated that some device samples and/or some defect types can have distinct PSA signatures without the use of energetic beams. For these devices and/or defect types, the use of energetic beams may not be necessary.

In some embodiments, the energetic beam source 180 can be a light source. Known techniques such as Light-Induced Voltage Alteration (LIVA) or Thermally-Induced Voltage Alteration (TIVA) can be used to alter the electrical properties of device sample 150, thereby enhancing its PSA signatures. A system implementing the LIVA technique uses a light source that irradiates and scans the surface of an integrated circuit with focused light. The focused light has photon energy near or above the bandgap energy of the semiconductor material of the integrated circuit. A system implementing the TIVA technique uses a light source that irradiates and scans electrical conductors within an integrated circuit with focused light. The focused light has photon energy less than the bandgap energy of the semiconductor material of the integrated circuit. The LIVA and TIVA techniques are known in the art, and, therefore, are not described in detail herein.

In some embodiments, the energetic beams can be X-ray beams. X-ray beams can change the electrical properties of the gate oxide of a semiconductor transistor and result in a shift in the threshold voltage (Vth) of the transistor. In some embodiments, ion beams or electron beams can also be used as the energetic beams.

As described above, one form of the dynamic stimulus is ripple voltage. FIGS. 3A-3C illustrate some examples of the ripple voltage in the form of a periodic waveform (such as a square wave in these examples). The periodic waveform can have either positive polarity or negative polarity (FIG. 3A). The periodic waveform can have a constant offset bias added to it (FIG. 3B). Further, the amplitude of the periodic waveform can be full rail, i.e., from ground to the normal operating potential, or smaller than full rail. FIG. 3C shows a periodic waveform that has a smaller than a full-rail swing in amplitude and has a constant offset bias added to it. As an example, a device specified to operate at 3 volts can receive a power supply that varies from 0 to 3 volts, from 0 to 0.5 volts, from 2.8 to 3.0 volts, or other voltage ranges not exceeding the manufacturer's specified level. As described above, another form of the dynamic stimulus is a sequence of logical lows and logical highs. These logical lows and logical highs can also have a smaller amplitude than the operating level specified by the manufacturer, and/or have an offset added to them.

Figure 4A:
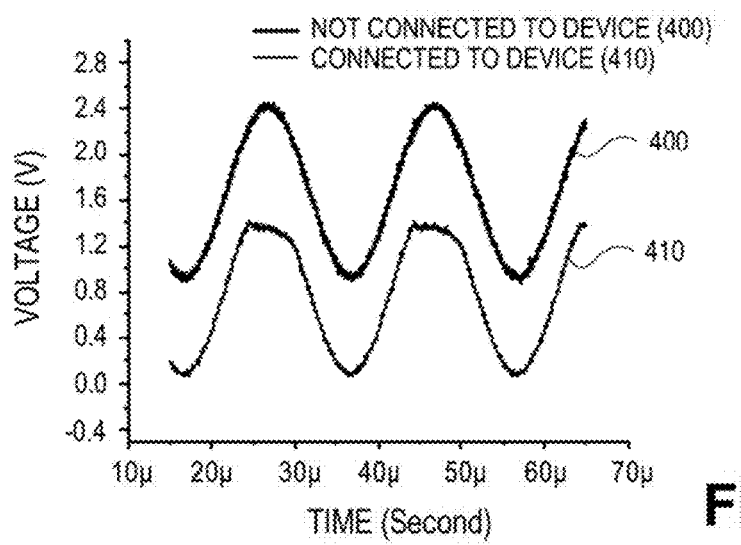
FIGS. 4A-4C illustrate an example of the changes measured at a power pin of a device when a power source is connected to the device.
Figure 4B:
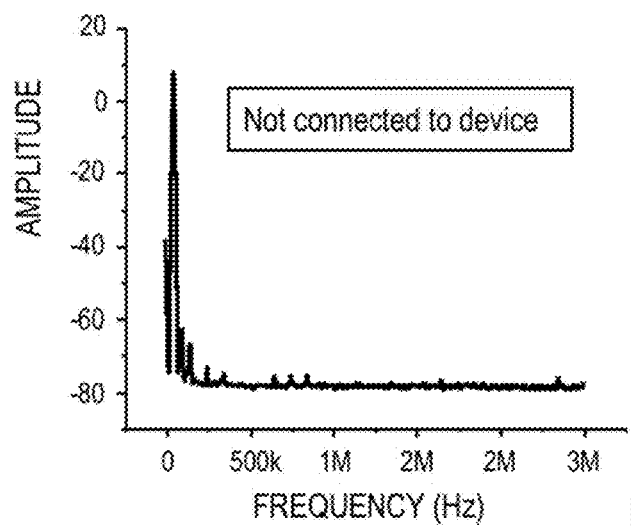
Figure 4C:
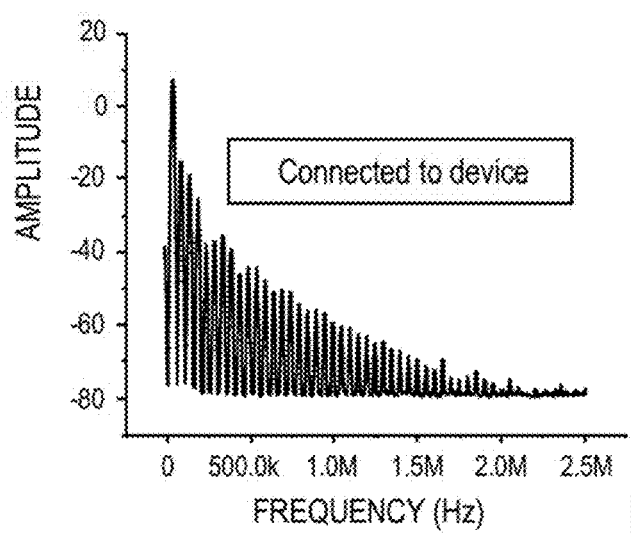

FIGS. 4A-4C illustrate an example of the changes measured at a power pin of a device when a power source is connected to the device. Referring to FIG. 4A, the time-domain waveform produced by a power source (e.g., power source 110 of FIG. 1) is a ripple voltage in the form of a sine wave 400. When power source 110 is not connected to device sample 150, the resulting output of spectrum analyzer 120 is shown in FIG. 4B. When power source 110 is connected to power pin 151 of device sample 150, the voltage measured at power pin 151 is a sine wave 410 that is slightly offset and slightly distorted when compared with sine wave 400. The resulting power spectrum measured at power pin 151 when device sample 150 is connected to power source 110 is shown in FIG. 4C. FIGS. 4A-4C show that loading a device to a power source can change the voltage output of the power source, and this change is more clearly visible in the frequency domain than in the time domain. Further, even though the power spectrum measurement is made at a pin that receives an undistorted sine wave (sine wave 400), the resulting power spectrum is different from the power spectrum of sine wave 400 and contains a unique characterization of the electrical property of device sample 150.

Figure 5:
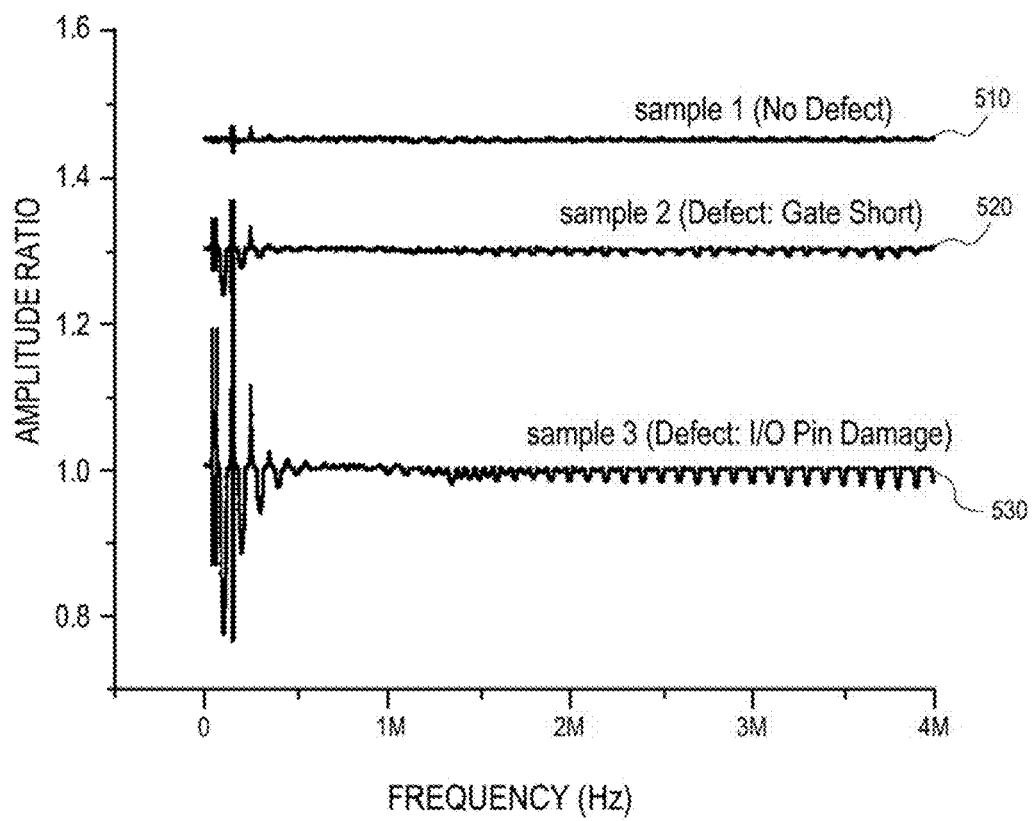
FIG. 5 illustrates examples of three PSA signatures.

FIG. 5 is an example of PSA signatures 510, 520 and 530 of three different samples of a device. PSA signature 510 is associated with a device sample 1 with no defects. PSA signature 520 is associated with a device sample 2 with a short-circuit defect in gate oxide. PSA signature 530 is associated with a device sample 3 with I/O pin damage. The PSA signatures 510, 520 and 530 are generated by dividing the amplitudes of power spectra of device sample 1, device sample 2 and device sample 3 by the amplitude of a known reference sample that has no defect. The resulting amplitudes of the PSA signatures are shown in log scale. A different amount of amplitude offset is added to each of PSA signatures 510 and 520 for ease of comparison of the three PSA signatures. It can be seen from FIG. 5 that PSA signatures 510, 520 and 530 are different from each other. Once a given device sample is identified as having the same distinct features (shape, peak location, amplitude, and the like) of one of PSA signatures 510, 520 and 530, it can be inferred that the device sample is likely to have the same electrical property (as well as defects, if any) as device sample 1, device sample 2, or device sample 3.

Figure 6:
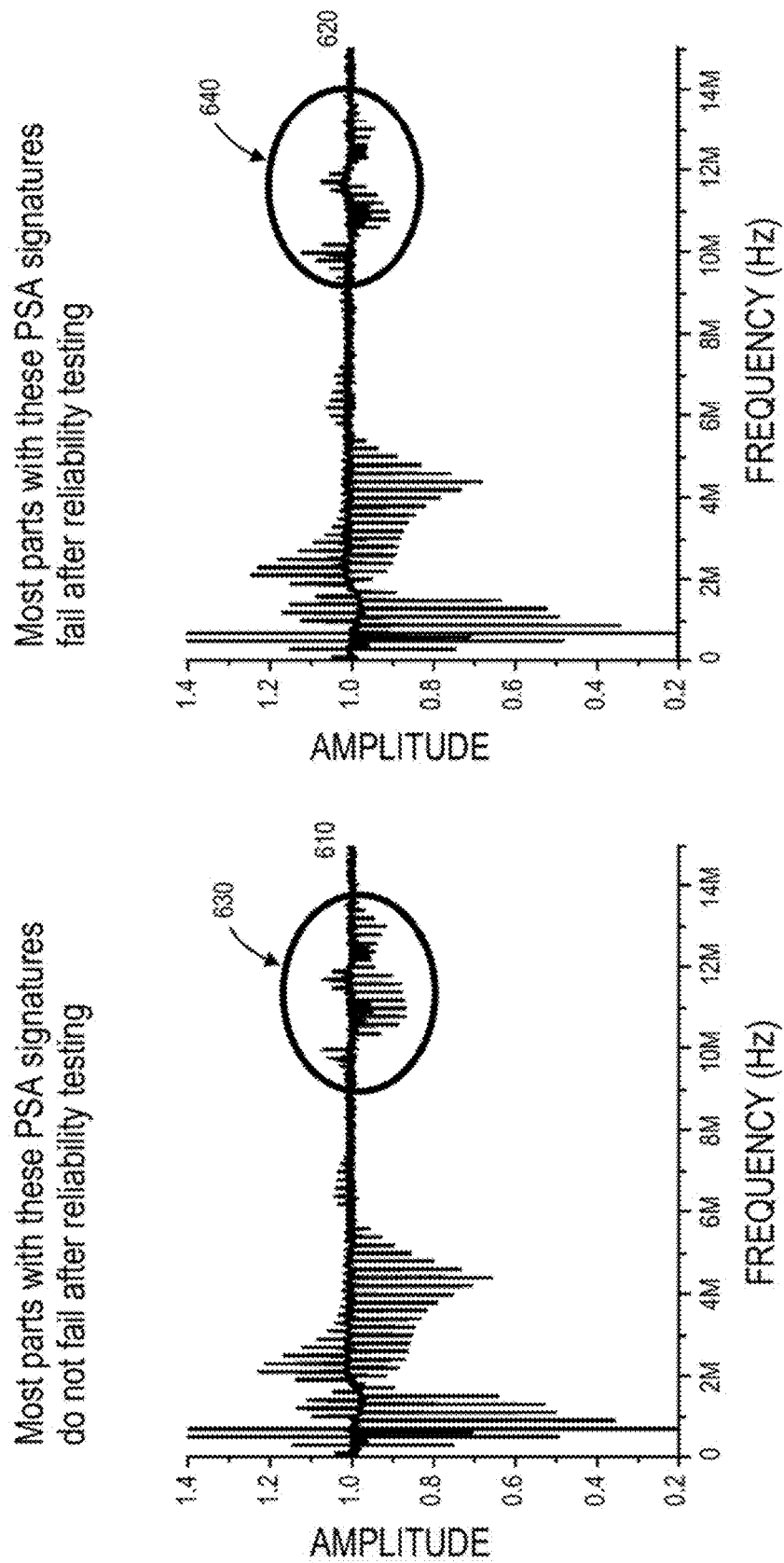
FIG. 6 illustrates an example of PSA signatures of a first device sample that has a latent defect and a second device sample that has no defects.

FIG. 6 is an example of PSA signatures 610 and 620 that are collected, respectively, from a first device sample that does not fail and a second device sample that fails in reliability testing. Initially, the first and second device samples are both functioning normally and correctly. PSA signatures 610 and 620 are measured before the reliability testing. The circled regions (regions 630 and 640) contain the portions of PSA signatures 610 and 620 that can be distinguished from each other. During the reliability testing, a series of high voltages, high temperatures, or a combination of both, are applied to the first and second device samples. In some embodiments, an energetic beam can be injected to the first and second device samples to accelerate the formation of defects that cause device failure. As a result of the reliability testing, the second device sample fails. That is, the second device sample is said to have a latent defect, which does not affect the normal function of the device until after a period of use in a stressed condition (e.g., high voltage and/or high temperatures). The second device sample can undergo further tests to identify the types of defects and the location of the defects. The corresponding PSA signature 620 is said to be a failure precursor, because its distinct features can be used as an early indication of a possible failure. That is, if a given device sample has a PSA signature similar to PSA signature 620, that given device sample is likely to fail in the same reliability testing. In some embodiments, a PSA signature can also be used to indicate mean-time-to-failure (MTTF) of a device sample. For example, if the second device sample fails after three hours into the reliability testing, another device sample having a PSA signature similar to PSA signature 620 is likely to fail at about the same time. Thus, the use of a PSA signature may replace or at least supplement some portion of reliability testing to cut down the testing and production cost.

We will now provide one non-limiting example of a method for screening defects in devices such as integrated circuits. The method may be implemented using different combinations of software, firmware, and/or hardware.

First, a database is established to store a collection of PSA signatures (i.e., power spectra) associated with a collection of device samples that have a known defect status (i.e., have no defects or have known defects). The database can be stored, e.g., within a computer system or it can be made accessible by a computer system via a network. The database can be established by measuring the power spectrum of each device sample, subjecting each device sample to reliability testing and see whether it fails. If it fails, one or more known defect location(s) and/or determination techniques (such as LIVA and TIVA) can be used to localize the defect and/or to determine the type of defect. The PSA signature taken before the reliability testing can be stored in the database and associated with a defect status of the determined defect type. If the device sample does not fail, its PSA signature (taken before the reliability testing) can be stored in the database and associated with a defect status of no defects.

Continuing with the present example, a computer system receives a PSA signature (i.e., power spectrum) associated with a sample of a device. The sample has a number of pins, and at least one of the pins is coupled to a signal generator that supplies a time-varying electrical signal to the sample. Optionally, the sample of the device is exposed to an energetic beam that is used to enhance PSA signatures. The PSA signature (i.e., power spectrum) of the sample is measured at one of the pins of the sample. The computer system identifies an indication of a defect in the device sample based on results of comparing the power spectrum of the sample with one or more power spectra of the device that have a known defect status. The power spectra used in the comparison can be the power spectra stored in the database. The stored power spectra can be measured experimentally, generated based on theoretical modeling, or a combination of both. Thus, based on the result of the comparison, the computer system is able to determine whether a defect exists in the device sample, and, if a defect exists, identify the type of defect in the device sample.

It will be understood that the various computational techniques described here can be implemented using code and data stored and executed on one or more computer systems (e.g., a server, a workstation, a desktop, a laptop, or other computer systems). Such computer systems store and communicate (internally and/or with other computer systems over a network) code and data using non-transitory machine-readable or computer-readable media, such as non-transitory machine-readable or computer-readable storage media (e.g., magnetic disks; optical disks; random access memory; read only memory; flash memory devices; and phase-change memory). In addition, such computer systems typically include a set of one or more processors coupled to one or more other components, such as one or more storage devices, user input/output devices (e.g., a keyboard, a touch screen, and/or a display), and network connections. The coupling of the set of processors and other components is typically through one or more busses and bridges (also termed as bus controllers). The storage devices represent one or more non-transitory machine-readable or computer-readable storage media and non-transitory machine-readable or computer-readable communication media. Thus, the storage device of a given computer system typically stores code and/or data for execution on the set of one or more processors of that computer system.

We have found that when it is applied to PSA spectra, principal component analysis (PCA) can be a valuable aid for distinguishing between sample sets drawn from different populations. PCA is a well-known technique in other contexts, and there are many commercially available software tools that apply PCA for analyzing data. However, we believe we are the first to apply PCA to PSA spectra and to recognize the advantages that this offers for detecting defects, counterfeits, and other anomalies in electronic circuits and components.

As PCA is well-known, its general character will be described only briefly here. PCA projects a data set to a new coordinate system by computing the eigenvectors and eigenvalues of the covariance matrix of that data set. Covariance of two random variables (2 dimensions) can be expressed as $$\mathrm{cov}(x, y) = \sum_{i=1}^{N} \frac{(x_i - x_{mean})(y_i - y_{mean})}{N};$$

where $x_i$ and $y_i$ are the values of variables x and y for the $i^{th}$ sample in the data set. N is the number of samples in the data set. The quantities $x_{mean}$ and $y_{mean}$ are the mean values for all the N samples for variables x and y respectively. The covariance matrix for the data set with 3 random variables, for example, can be expressed as $$C = \begin{bmatrix} \mathrm{cov}(x, x) & \mathrm{cov}(x, y) & \mathrm{cov}(x, z) \\ \mathrm{cov}(y, x) & \mathrm{cov}(y, y) & \mathrm{cov}(y, z) \\ \mathrm{cov}(z, x) & \mathrm{cov}(z, y) & \mathrm{cov}(z, z) \end{bmatrix}$$

The cov (x, x), cov (y, y) and cov (z, z) are just the values of variance for variables x, y, and z respectively. If there are n variables in the data set, the covariance matrix will have the n×n dimensions.

After the eigenvectors and eigenvalues of the covariance matrix are calculated, the eigenvalues are then ranked; the eigenvector with the largest eigenvalue is the most significant principal component, Principal Component 1, (PC1) of the data set. The next significant principal component is Principal Component 2 (PC2) which has the second largest value of eigenvalue, followed by PC3, PC4, PC5, etc. In general, most of the variability of a data set with a large number of variables, such as those for PSA spectra (in which there may be hundreds of variables) can be accounted for by just three Principal Components (PC1, PC2, and PC3). The values of all variables for all samples in the data set can then be transformed into a new three-dimensional coordinate system using the three orthogonal eigenvectors (PC1, PC2 and PC3). The main advantage of PCA component analysis is that variability of a data set with a large number of variables can be visualized in a three-dimensional plot.

Many details in the above discussion have been omitted for brevity, but at the peril of oversimplification. For a fuller account, the interested person is urged to consult any of the many standard treatments of PCA that are available.

We have applied PCA in the analysis of PSA spectra that we have measured on electronic devices and components of various kinds according to the procedures described above. The variables in a typical PSA spectrum for PCA analysis are 400-800 discrete spectral amplitude values, each value corresponding to a specific frequency bin. PCA can of course also be applied for spectra having fewer than 400 values or more than 800 values.

We have found that most of the variability in the data is already subsumed into the first few Principal Components. As a consequence, we can obtain useful and meaningful results even with a drastic reduction in the dimensionality of the data space. For example, a typical spectrum has amplitude values at 800 different frequency bins, but PCA with only the first three Principal Components will lead to a three-dimensional distribution plot that is easily visualized and that still yields useful information. In some cases, as few as two Principal Components may suffice. Of course, any number of Principal Components up to the number n of variables of the data set may be used, but more than six will not typically be desired because of diminishing returns due to the rapid fall-off in the variance after the first few Principal Components.

For visualization, the PCA distributions are normally presented either in a two-dimensional or a three-dimensional coordinate system. Two-dimensional distributions can be presented by any combinations of two Principal Components, such as PC1-PC2, PC2-PC3, PC3-PC4, PC4-PC5 or PC5-PC6. Three-dimensional distributions can be presented by any combinations of three Principal Components, such as PC1-PC2-PC3, PC2-PC3-PC4, PC3-PC4-PC5, or PC4-PC5-PC6.

Figure 7:
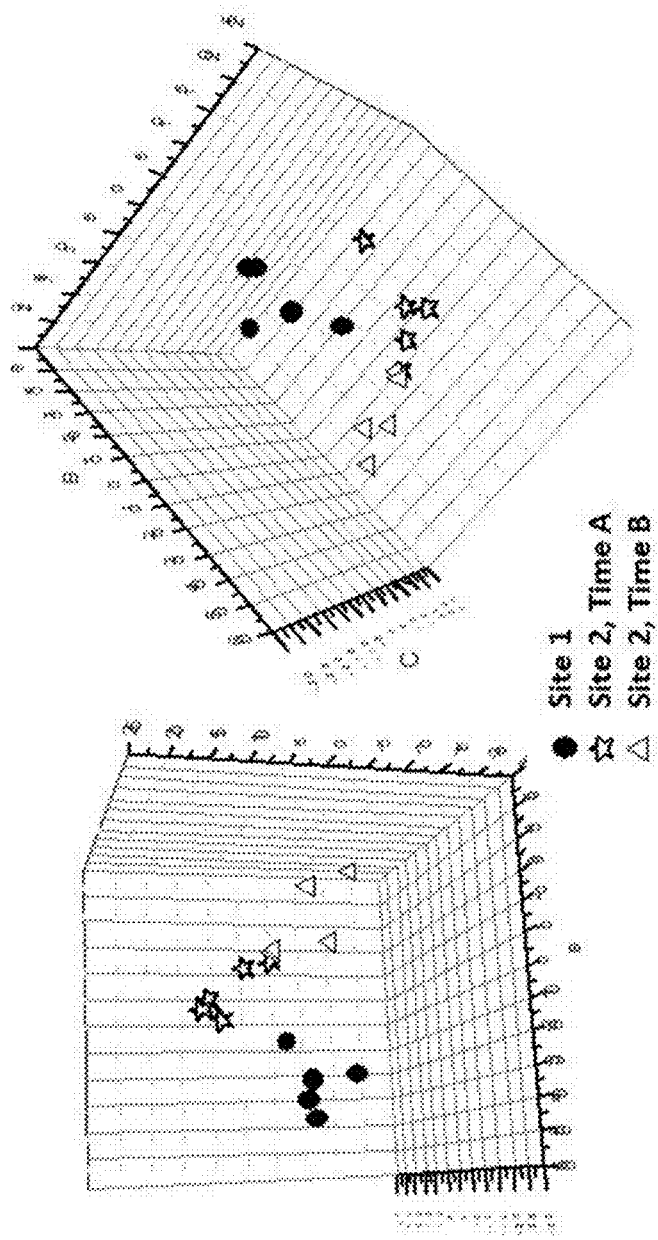
FIG. 7 provides three-dimensional PCA distribution plots visualized from three data sets of PSA spectra. The PCA distributions are visualized from two different perspectives. The PSA spectra were all taken on application-specific integrated circuits (ASICs) having the same design and made at the same foundry, but at different times or places.

By way of example, three-dimensional PCA distribution plots (i.e. plots using PC1, PC2, PC3) visualized from three data sets of PSA spectra are shown in FIG. 7; the PCA distributions are visualized from two different perspectives. The PSA spectra were all taken on application-specific integrated circuits (ASICs) having the same design and made at the same foundry, but at different times or places. The filled black circles represent one manufacturing site, whereas the open stars and triangles represent a different manufacturing site of the same foundry. The open stars and triangles represent different manufacturing lots made about six months apart, but from the same manufacturing site. It will be seen that the data clusters from the two manufacturing sites are well separated from each other; there is overlap between the clusters from the same site but different times.

Figure 8:
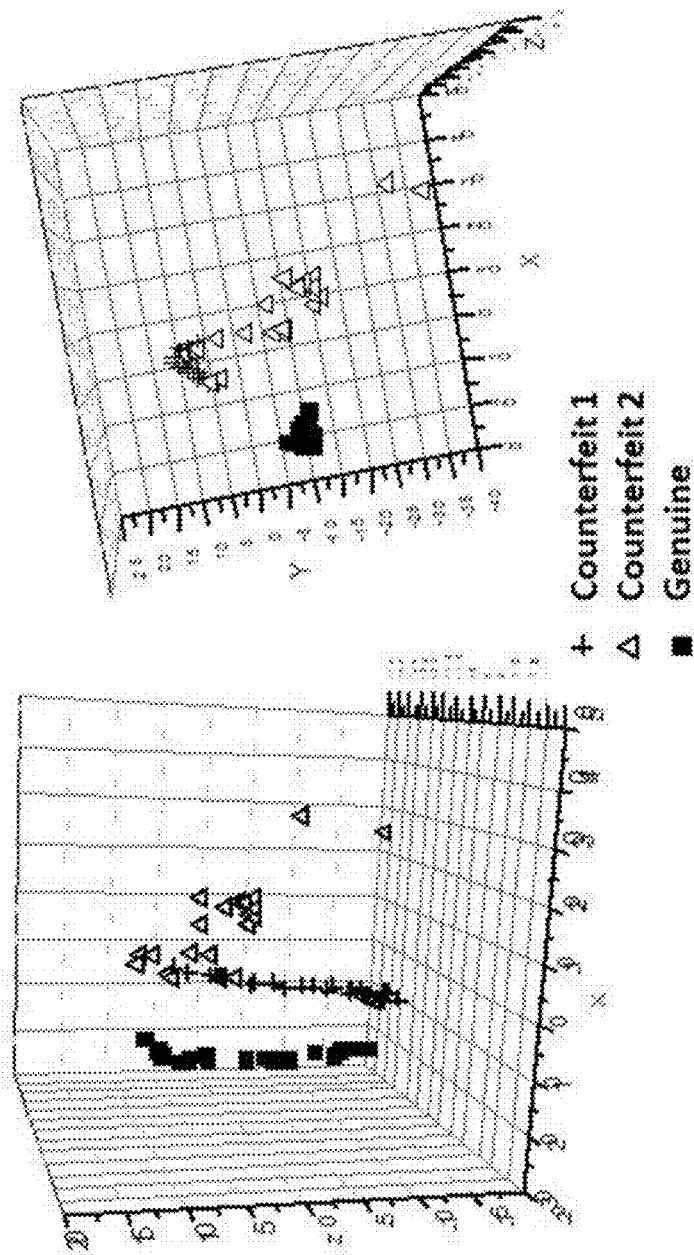
FIGS. 8 and 9 provide the PCA distributions of the first three Principal Components of the PSA spectra of samples of a commercially available field-programmable gate array (FPGA) as obtained from three different distributors. The distributions are shown from two different perspectives. The two figures differ in that different biasing conditions were used to excite the PSA spectra.
Figure 9:
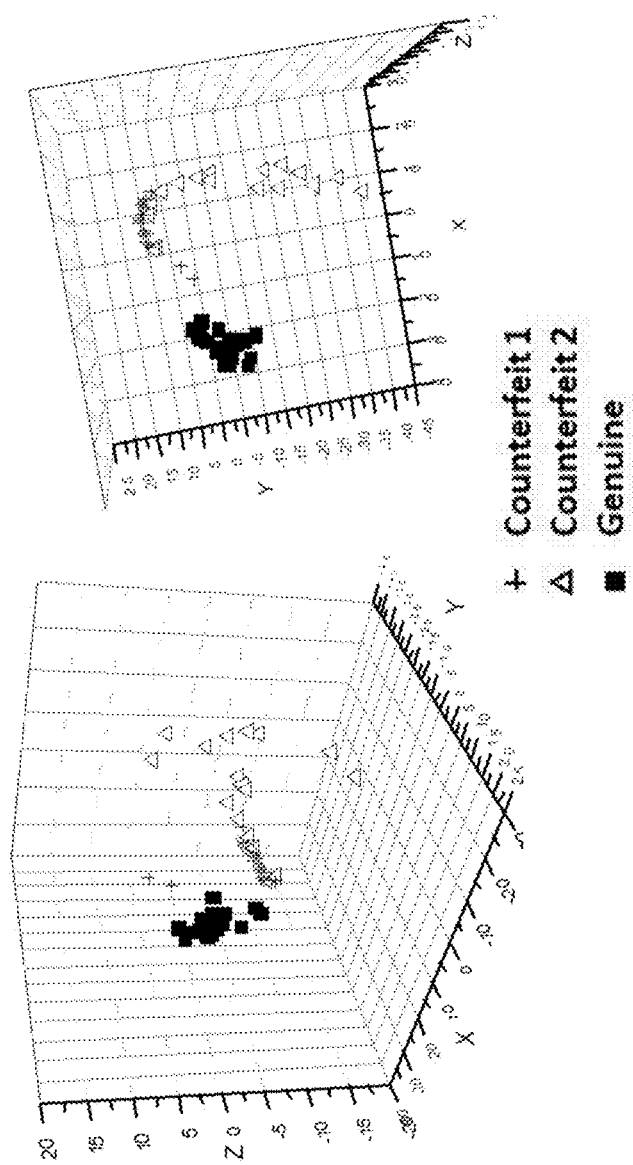

In another example, each of FIGS. 8 and 9 shows the PCA distributions of the first three Principal Components of the PSA spectra of samples of a commercially available field-programmable gate array (FPGA) as obtained from three different distributors; the distributions are shown from two different perspectives. The two figures differ in that different biasing conditions were used to excite the PSA spectra.

Distinct clusters are seen in both figures, but the clusters have different shapes for the different biasing conditions. The solid squares in both FIG. 8 and FIG. 9 represent samples classified as "genuine" for purposes of the study, whereas the crosses and open triangles represent samples classified as "counterfeit". There is a clear separation, without overlap, between the genuine and counterfeit populations. There is a significant overlap between the two counterfeit population clusters under both biasing conditions.

Figure 10:
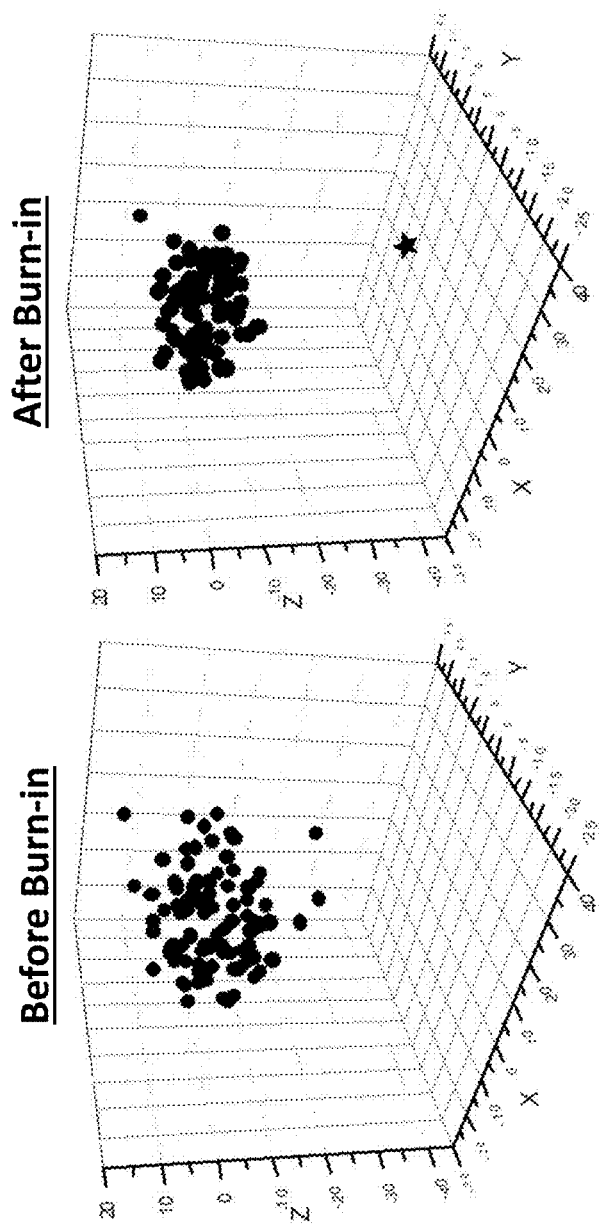

In another example, FIG. 10 shows a three-axis PCA-PSA analysis of a batch of ASICs before and after burn-in, i.e., after accelerated elevated-voltage and elevated-temperature stress. One of the devices is marked with a star in the scattergrams. That device is seen to occupy an outlier location after the burn-in. In this wise, a probable latent defect has been detected non-destructively after burn-in.

Figure 11:
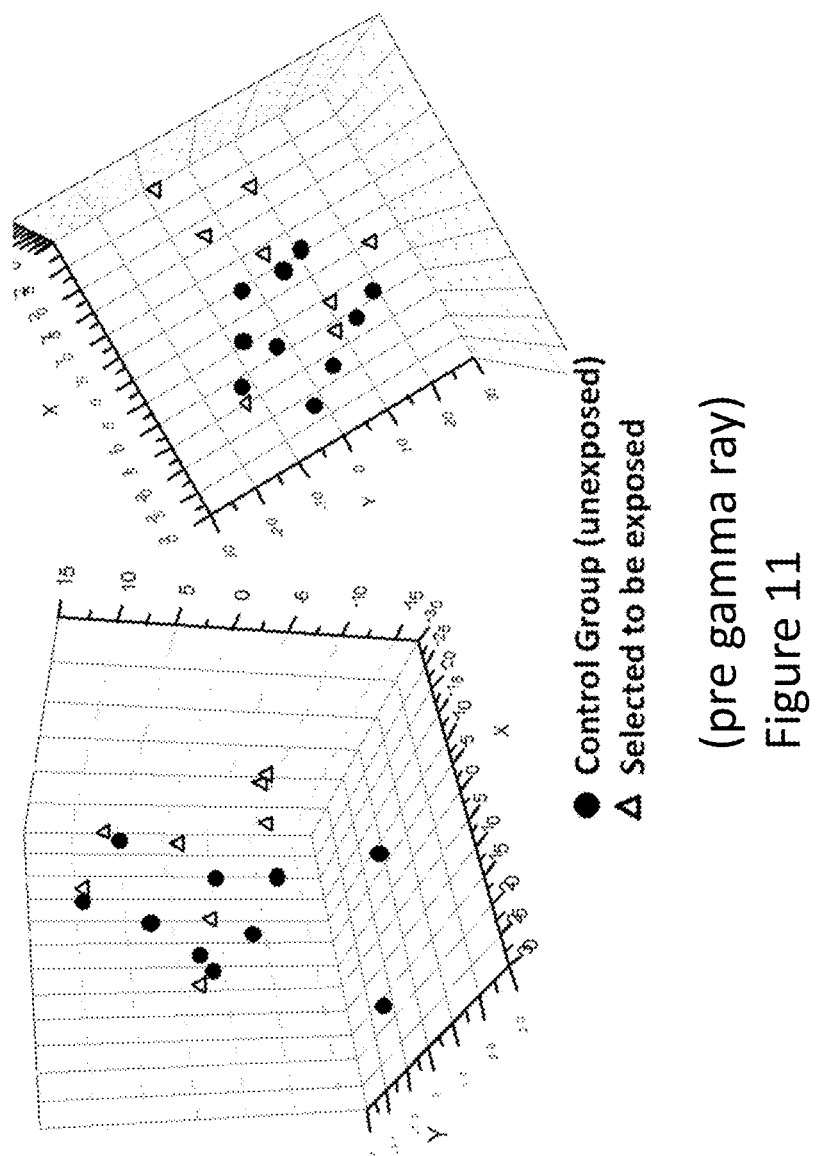
FIGS. 11 and 12 respectively provide a three-axis PCA-PSA analysis of a batch of ASICs before and after a subset of the ASICs were subjected to gamma-ray exposure.
Figure 12:
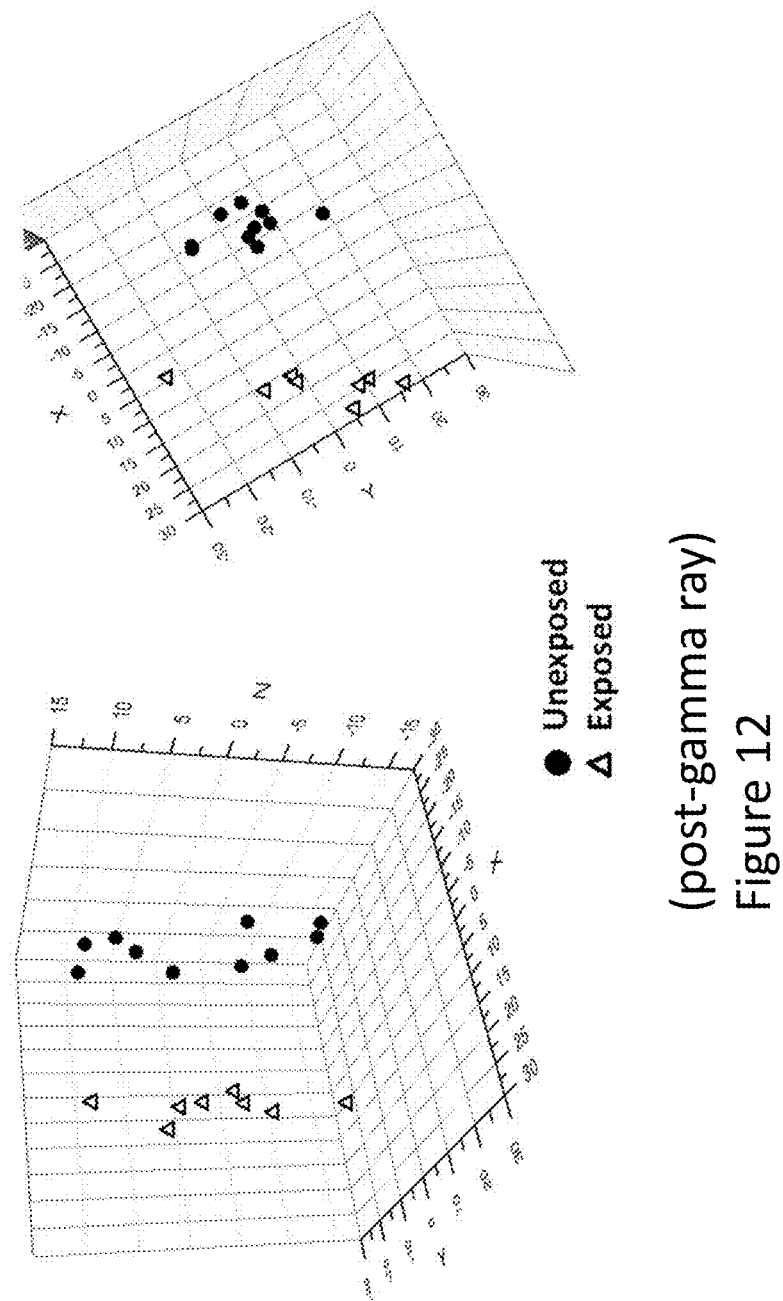

In another example, FIGS. 11 and 12 respectively show a three-axis PCA-PSA analysis of a batch of ASICs before and after a subset of the ASICs were subjected to gamma-ray exposure. The samples identified by the open triangles were those selected for exposure, and the samples identified by the filled circles were the control group. It will be seen that the PCA analysis clearly separates the exposed population from the unexposed population.

Figure 13:
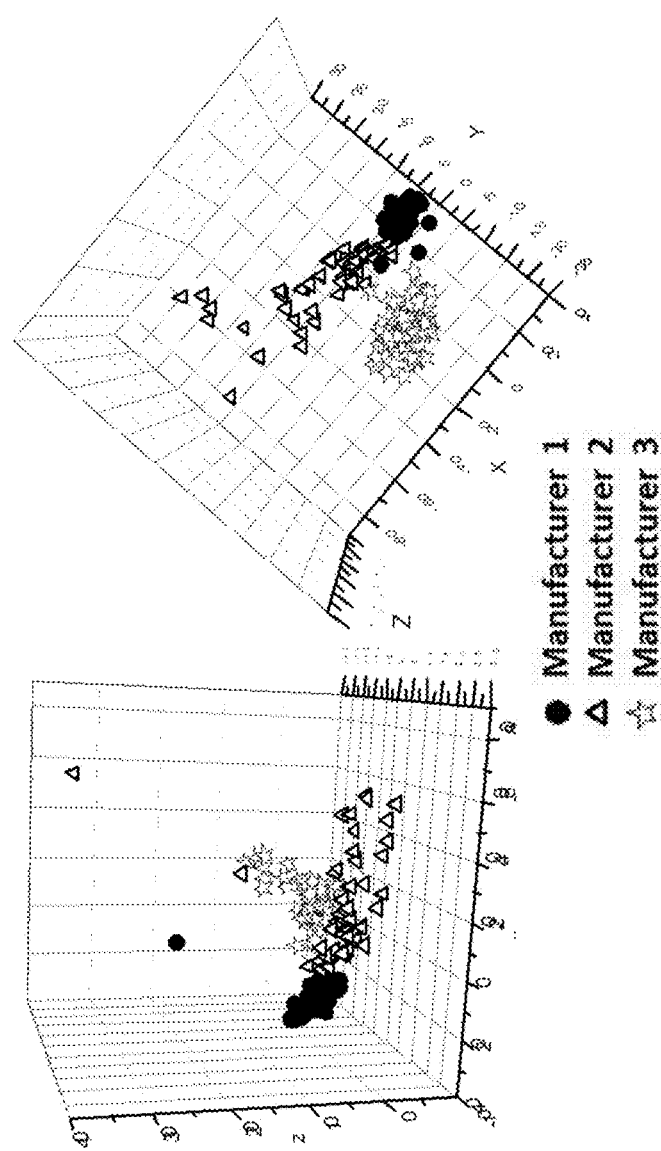
FIGS. 13 and 14 respectively provide a three-axis PCA-PSA analysis of batches of 0.1-microfarad tantalum capacitors from three different manufacturers under two different biasing conditions.
Figure 14:
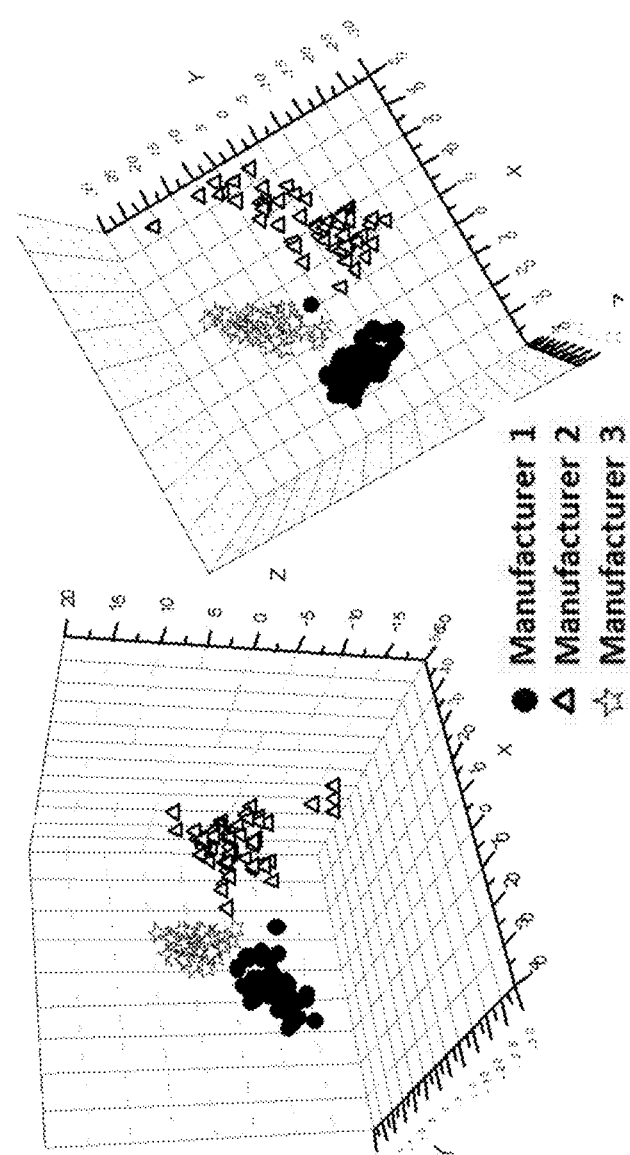

In another example, FIGS. 13 and 14 respectively show a three-axis PCA-PSA analysis of batches of 0.1-microfarad tantalum capacitors from three different manufacturers (respectively symbolized by solid circles, open triangles, and open stars) under two different biasing conditions. It will be seen that the data points tend to segregate according to the provenance of the devices, but that the biasing conditions of FIG. 14 produce a greater separation between clusters than the biasing conditions of FIG. 13. It will also be seen that outlying data points are distributed differently between the two figures. This may indicate that different biasing conditions can complement each other when searching for probable defects.

The above examples are indicative of some of the differences that can be detected using the PCA-PSA technique. These differences include sourcing from different manufacturers or foundries, different processing histories, different memory sizes and different aging history. The technique can also be used to detect counterfeits, alterations, defects, and failure precursors, and to detect changes induced by factors such as radiation exposure, burn-in, and actual and simulated aging. The above examples also indicate that the technique is useful when applied to devices over a wide range that includes both discrete devices, such as capacitors and diodes, and complex ASICs having tens of millions of transistors. The technique may also be useful for helping to predict the remaining lifetimes of devices.

Accordingly, it will often be beneficial to those manufacturing and distributing electronic devices to compile a reference library of PCA-PSA data to be used in the quality assessment of selected devices. For example, the PCA-PSA spectrum is taken of a selected device, and the spectrum is reduced to a data point in a principal-component space of reduced dimensionality such as the three-dimensional spaces discussed in the examples above. The data point is then compared to the reference data for a normative device of the kind selected, and a determination is made whether the data point falls within the normative distribution with enough confidence for the selected device to be deemed acceptable. If the confidence is great enough, the selected device is thus imputed to belong to the reference population.

The reference data may take any of various forms. In some examples, they may be stored directly as collections of individual data points. In other examples, they may be stored as the parameters of statistical distributions such as means and standard deviations on each of the principal axes. Of course the biasing conditions, the spectral bins, and the principal component decomposition must be specified.

In some examples, it will be useful, for a given type of device, to store different sets of reference data that are representative of different populations. By way of example, the different populations may have different ages, or they may be from different suppliers, or they may have different cumulative radiation exposures, or they may have different, known processing histories, or they may have different packaging. Some of the populations may be chosen because they share the same known defect.

In a more complex assessment, the PCA-PSA data point of a selected device is compared to the reference data for several such populations, in order to impute the selected device to one (or more) of the populations, i.e. to make an inference as to which population is the one to which the selected device most likely belongs. Such an approach can be especially useful for, among other things, sorting devices by provenance, sorting potentially defective devices by defect type, and sorting devices by expected remaining lifetime.

Of course any number of different biasing schemes can be used to produce respective sets of reference data. It will often be advantageous to repeat comparisons of the types described above with different biasing schemes in order to provide more discriminating and more accurate classifications of the selected devices. For such purposes, the biasing schemes may include both normal biasing and off-normal biasing.

Off-normal biasing is a biasing scheme that does not require the device under test (DUT) to be functional or in a known functional state during the biasing. An example of off-normal biasing is to supply periodic pulses between a power and a ground pin while the other pins are floating or biased (possibly through a load resistor) at constant voltages. Examples of periodic pulses that may be suitable for this purpose include square waves, sinusoidal waveforms, and periodic envelope waveforms in which each envelope contains a frequency-chirped square-wave or sinusoidal waveform.

Another example of off-normal biasing is to supply periodic pulses between a power pin and a ground pin while certain specifically selected pins are electrically connected to the power pins and other pins are floating or biased at constant voltages.

Normal biasing, by contrast, is any biasing scheme that requires the DUT to be in a known functional state; this is the type of biasing scheme used in normal electrical testing such as is performed using a conventional circuit tester.

Normal biasing is often performed using input in the form of a complex logical test sequence that is meant to place the DUT in known functional states. The stimuli that we use for off-normal biasing are different. In particular, they do not contain logical information.

As explained above, there are cases when valuable complementary information can be obtained by varying the biasing conditions. In some cases, valuable complementary information can also be obtained by varying the frequency range of the PSA spectrum or by varying the Principal Component selection, i.e. the choice of which three (for example) Principal Components should define the vector space in which the DUT is compared to the reference population.

FIGS. 15-17 provide an illustrative example. These figures represent populations of complex ASICs (the ASICs have several million transistors each) all having the same nominal function. The ASICs were provided in three different lots, denominated Lot 1, Lot 2, and Lot 3. Lots 2 and 3 had similar processing parameters on the device die, but the processing parameters for Lot 1 were slightly different. Within each lot, there were two different package types, denominated "old" and "new". The two package types had different wiring layouts that could not be distinguished by conventional electrical testing, although they could be distinguished using x-ray or deprocessing techniques.

The Principal Component selection of FIG. 15 is PC1, PC2, PC3. The left-hand scatterplot and the right-hand scatterplot of FIG. 15 represent the same biasing conditions, denominated Biasing 1, but with the PSA spectra taken over different frequency ranges, denominated Frequency Range 1 and Frequency Range 2. Turning to the scatterplot on the left, it will be seen that the data fall into two clusters: The solid triangles for Lot 1/New Package form one cluster. The x-marks for Lot 2/New Package+Lot3/New Package form a portion of the second cluster. The distribution of open circles for Lot 2/Old Package overlaps the x-marks and forms a portion of the same cluster. Thus the Lot 1, New Package population is well separated in the left-hand scatterplot.

Two clusters will also be seen upon reference to the right-hand scatterplot. There, the open circles for Lot 2/Old Package form a distinct cluster, but the distribution of solid triangles for Lot 1/New Package overlaps the distribution of x-marks for Lot 2/New Package+Lot3/New Package. Hence it is the Lot 2/Old Package that is well separated in the right-hand scatterplot.

Thus it will be appreciated that Frequency Range 1 and Frequency Range 2 produce complementary results, in that by combining them, it is possible to distinguish all three populations.

The Principal Component selection of FIG. 16 is PC1, PC2, PC3. The left-hand scatterplot and the right-hand scatterplot of FIG. 16 represent the same biasing conditions, denominated Biasing 2. As noted, the Biasing 2 conditions are different from the biasing conditions of the previous figure. As in the previous figure, the left-hand plot represents Frequency Range 1, and the right-hand plot represents Frequency Range 2.

The left-hand scatterplot shows three clusters. The distribution of open circles for Lot 2/Old Package is well separated. The distribution of solid triangles for Lot 1/New Package and the distribution of x-marks for Lot 2/New Package+Lot 3/New Package form core clusters that are mostly well separated, except that a few straggler solid triangles from Lot 1/New Package overlap the distribution of x-marks for Lot 2/New Package+Lot 3/New Package.

Turning to the right-hand scatterplot, it will be seen that changing to Frequency Range 2 increases the separation of the Lot 2/Old Package (open circles) population from the other populations, but decreases the separation between the Lot 1/New Package (solid triangles) population and the Lot 2/New Package+Lot 3/New Package (x-marks) population.

A comparison between FIG. 15 and FIG. 16 shows that the effect of changing the frequency range in the PCA-PSA analysis can have different outcomes, depending on the concurrent choice of biasing conditions.

FIG. 17 displays data resulting only from Biasing 1 and Frequency Range 1. However, the Principal Component selection of the left-hand scatterplot is PC1, PC2, PC3, whereas for the right-hand scatterplot it is PC3, PC4, and PC5. As will be seen in the figure, the left-hand scatterplot shows a well-separated cluster of solid triangles for the Lot 1/New Package population. A second cluster consists of the open circles for the Lot 2/Old Package population intermixed with the x-marks for the Lot 2/New Package+Lot 3/New Package population.

Turning to the right-hand scatterplot, it will be seen that changing to the second set of Principal Components caused most of the Lot 2/Old Package distribution (open circles) to separate from the Lot 2/New Package+Lot 3/New Package distribution (x-marks), whereas the Lot 1/New Package distribution (solid triangles) intermixed with Lot 2/New Package+Lot 3/New Package (x-marks) distribution.

Thus it will be appreciated that in the example of FIG. 17, the consideration of two distinct Principal Component selections produced complementary results, in that by combining them, it is possible to distinguish all three populations with relatively little overlap. Often, it will be most effective to select non-overlapping sets of Principal Components. However, different Principal Component selections should be deemed "distinct" in this regard even if they differ by as few as only one or two components.

Other types of data analysis may also provide information that, for the purpose of classifying a sample device, is complementary to the information provided by PCA. For example, the statistical mean and the standard deviation are examples of statistical information that can be derived from the power spectrum when the power spectrum is treated as a statistical distribution. Statistical parameters such as these, as well as similar quantities, can be used to provide information that complements the PCA, as will be shown in examples below.

Another type of statistical information that can be useful in the same regard is the cumulative distribution function (CDF), or a related distribution function, of a parameter or variable derived from the PSA spectrum. One example is the CDF of an individual Principal Component. Another example is the CDF of a statistical parameter such as the standard deviation or the mean, as calculated on an individual PSA spectrum. Examples of such a use of CDFs are also provided below.

In an example, a sample population of Zener diodes, all having a similar production history, were subjected to heat treatment without electrical bias by baking at 140° C. The samples were divided into a no-bake control group and a group baked for 500 hours and then, after taking measurements, for a further 500 hours to make a total bake time of 1000 hours.

FIG. 18 displays three-dimensional PCA-PSA scatterplots for, respectively, the unbaked samples, the 500-hour bake, and the 1000-hour total bake. The solid triangles in the figure represent the control samples, the open circles represent the bulk of the baked samples, and the x-marks represent samples that were designated as "outliers".

FIG. 19 displays the CDFs of, respectively, PC1, PC2, and PC3 of the pre-bake (solid squares), 500-hour (open circles), and 1000-hour (x-marks) populations. It will be understood from FIG. 19 that by applying a threshold at the 90$^{th}$ or 95$^{th}$ percentile, for example, it is possible to identify a substantial portion of the outlying sample devices even when fewer than all three Principal Components are considered. It can be advantageous to leave such outlying samples out of the reference population used for classifying a device under test.

As explained above, the standard deviation is one example of a statistical parameter of a PSA spectrum that can be a useful complement to PCA-PSA. In simple terms, the standard deviation is a measure of the roughness of the spectrum, in that a relatively flat spectrum will have a low standard deviation, whereas a spectrum having many high peaks and deep valleys will have a large standard deviation.

FIG. 20 displays the CDFs of the standard deviations of, respectively, the test sample PSA spectra and the control sample PSA spectra. For the test samples, the CDFs are provided for, respectively, the pre-bake population (solid squares), the 500-hour bake (x-marks), and the 1000-hour bake (open circles). As the figure shows, the pre-bake CDF is well separated from the two post-bake CDFs, and there is some significant separation between the 500-hour CDF and the 1000-hour CDF. This information can be used in various ways to complement the PCA-PSA. For example, a joint consideration of the CDF data with the PCA-PSA data can enhance the confidence with which a given test device is imputed to one or another reference population.

As explained above, the statistical mean is another example of a statistical parameter of a PSA spectrum that can be a useful complement to PCA-PSA, as is illustrated by FIGS. 21 and 22. FIG. 21 displays a three-dimensional PCA-PSA scatterplot of a population of high-voltage diodes that were either control samples (solid triangles) or test samples that were baked without bias for a total of 1000 hours at 140° C. (open circles). The left-hand scatterplot displays the pre-bake data, and the right-hand scatterplot displays the post-bake data (in which the control samples are included for reference). It will be seen that no clear differences appear between the pre-bake and the post-bake PCA distributions.

In FIG. 22, the left-hand scatterplot displays the CDFs of the test samples respectively pre-bake (solid squares) and after a total bake of 500 (x-marks), 1000 (open stars), and 1500 (inverted open triangles) hours. The right-hand scatterplot displays the CDFs of (unbaked) samples selected as control samples for, respectively, the pre-bake population and the populations baked for 500, 1000, and 1500 total hours. It will be seen that little separation is achieved among the various baked populations. However, there is a significant separation between the CDF of the unbaked population and the CDFs of the baked populations, in contrast to PCA distributions (FIG. 21) where no clear differences are observed between pre-baked and post-baked distributions. Thus information provided by CDFs of statistical parameters can, for example, enhance the confidence with which a given device under test is imputed to one or another reference population.

PCA-PSA techniques as described above can be used for verifying and controlling process flow on semiconductor fabrication lines. For example, devices can be assayed while still on-wafer. Massive numbers of devices can be assayed to provide individualized evaluations, or the wafers can be subdivided into blocks and one or a few devices assayed from each block. In either case, the information thus obtained can be used, e.g., to adjust process parameters to improve overall quality or quality on selected wafer blocks. In other examples, the information can be used to ascribe different quality levels to different portions of the wafer.

In manufacturing environments where assembly, integration, and packaging are performed, the above-described PCA-PSA techniques can be used generally for quality control and more specifically to confirm that individual devices or selected devices from a batch are good before incorporating them in a system, package, or larger assembly. Indeed, PCA-PSA techniques may be used by an integrated circuit (IC) manufacturer to assure that its processes are producing consistent results from year to year. By applying PCA-PSA analysis to competitors' products, a manufacturer might also be able to detect whether its proprietary processes are being imitated.

In one example scenario, an IC manufacturer sends its ICs to a packaging specialist. The manufacturer needs to assess the packaging specialist's quality and whether the condition of the ICs changed under the packaging specialist's handling. PCA-PSA techniques can be usefully applied for such a purpose.

It is also common for users of systems and subsystems to perform routine testing under conditions, such as high temperature, that could affect the subsequent performance of integrated circuits in the tested systems. One possible application of PCA-PSA techniques is to confirm that the post-test performance of the ICs remains normal.

In some manufacturing processes, it may be desirable to confirm that the integrity of electronic devices is preserved during a hazardous process step such as a soldering or deposition step performed at elevated temperature. Such a confirmation may be provided by comparing the results of PCA-PSA tests performed on at least some devices before, and again after, the hazardous process step. The reference data used for such an approach would beneficially include post-process data that represent devices that are acceptable notwithstanding that there might be differences between the pre-process and post-process data.

When an order of product electronic devices is shipped from a source to a destination, the destination party might sometimes want to receive the products with assurance that they have not been subjected to tampering or deterioration.

One way for the shipper to provide such assurance is to send the PCA-PSA data together with the products, while agreeing in confidence on the testing protocol, i.e. on the biasing conditions and the spectral frequency bins. The receiving party can repeat the tests at the receiving location to verify that the products are in substantially the same condition as when they left the source location.

One advantage of the PCA-PSA technique is that it lends itself easily to visual inspection. For example, an operator on a manufacturing line can run a PSA spectrum on a selected device, subject the spectrum to PCA analysis as described above, and display the result as a data point superimposed on a background representing the distribution of a reference population in two or three dimensions. Based on a simple visual inspection, the operator can determine whether the selected device should or should not be deemed to fall within the reference distributions.

FIG. 23 is a flowchart illustrating a non-limiting example process of the kind described above. A sample device is provided (10). A set of bias conditions is selected (20) and a frequency range is selected (30). A PSA spectrum is measured and stored (40) in a digital storage medium. An option is provided (50) to repeat the process with new bias conditions and/or with a new frequency range.

A Principal Component Analysis (PCA) is performed (60) in a computer on each PSA spectrum. Complementary information is also calculated (70) in the computer. The complementary information consists of the mean and standard deviation of each PSA spectrum.

A PSA spectrum is selected (80) and a Principal Component selection is made (90).

Reference data for a reference population are retrieved (100) from a digital storage medium. In the computer, the result of the PCA is compared (110) to the reference data and a comparison result is stored (120).

An option (130) is provided to retrieve (140) complementary data from the digital storage medium and to use the complementary data to compute (150) a modified comparison result.

An option (160) is provided to repeat the computation of a comparison result based on a new PSA spectrum and/or new Principal Components.

An option (170) is provided to perform a new comparison, and to store its result, based on a new set of reference data drawn from a new reference population.

A classification decision is made (180), based on the comparison results, that imputes the sample device to a reference population or, in some cases, designates the sample device as not belonging to any reference population. The classification decision may be as simple as a choice between "accept" or "reject". In other cases, the classification decision may impute the sample device to more than one reference population. In some cases, the classification decision may be the result of jointly considering multiple comparison results.

A further disposition is made (190) of the sample device in response to the classification decision. In non-limiting examples, such a disposition may involve physically segregating the sample device with other sample devices having similar classification decisions, or integrating the sample device into a product on condition that the sample device is accepted.

What is claimed is:

1. A method involving non-destructive testing of a sample device having a specified function in the context of electronic circuitry, comprising:

applying one or more off-normal stimuli to the sample device, wherein each off-normal stimulus is a periodic electrical signal, devoid of logical information, that is applied between a power pin and a ground pin of the device while each other pin is electrically connected to a power pin, is floating, or is biased at a constant voltage;

under each of the one or more off-normal stimuli, measuring at least one power spectrum at a selected pin of the sample device, wherein the measured power spectrum represents a response of the sample device to the respective off-normal stimulus, and wherein each power spectrum is taken over a multiplicity n of spectral bins;

performing a Principal Component Analysis (PCA) on each power spectrum, thereby to obtain a respective set of principal components of each power spectrum;

for each power spectrum on which a PCA has been performed, selecting at least one subset of the set of principal components, wherein the subset consists of fewer than n of the principal components;

comparing the subset or subsets obtained from the respective power spectra on which a PCA has been performed to stored reference data, thereby to obtain a comparison result, wherein the stored reference data include representations in terms of principal components of one or more reference populations of devices having the same specified function as the sample device;

classifying the sample device relative to reference populations, wherein the classification is based at least in part on the comparison result; and placing the sample device in a batch of devices confirmed for further processing if the sample device is classified as similar to a reference population of acceptable devices, but placing the sample device in a batch for disposal if it is not classified as similar to a reference population of acceptable devices.

2. The method of claim 1, wherein each selected subset of a respective set of principal components consists of no more than ten of the principal components.

3. The method of claim 1, wherein each selected subset of a respective set of principal components consists of two or three of the principal components.

4. The method of claim 1, wherein the classifying step comprises assigning the sample device to one of the represented populations.

5. The method of claim 1, wherein the classifying step comprises determining either that the sample device is imputable to one of the reference populations, or that the sample device is imputable to none of the reference populations.

6. The method of claim 1, wherein the classifying step comprises classifying the sample device as a member of either an accepted category or a rejected category, and physically segregating the sample device with other sample devices of the same category.

7. The method of claim 6, further comprising integrating the sample device into a product on condition that the sample device is accepted.

8. The method of claim 1, wherein:

each measured power spectrum is provided to a computer;

the computer performs the PCA on the measured power spectrum or spectra; and the comparing step is performed in the computer using reference data obtained by the computer from a digital storage medium.

9. The method of claim 1, wherein, in regard to at least one set of principal components:
the selecting step comprises selecting at least two different subsets of the set of principal components, each selected subset consisting of fewer than n of the principal components; and
the comparing step is repeated in respect to each of the selected subsets, thereby to produce a respective comparison result for each selected subset.

10. The method of claim 3, wherein the classifying step is performed with joint reference to all of the respective comparison results, thereby to produce a classification that is jointly responsive to all of the respective comparison results.

11. The method of claim 9, wherein the classifying step is repeated in respect to each of the respective classification results so as to classify the sample device with respect to a reference population at least twice, with each resulting classification being based at least in part on a different one of the respective comparison results.

12. The method of claim 1, wherein:
the method further comprises calculating at least one statistical parameter of at least one designated power spectrum of the sample device; and
in the classifying step, the classification of the sample device is based in part on a comparison between the at least one calculated statistical parameter and stored reference data.

13. The method of claim 12, wherein the at least one calculated statistical parameter comprises at least one of a mean and a standard deviation of the at least one designated power spectrum.

14. The method of claim 1, wherein:
the stored reference data include information concerning the statistical distributions of individual principal components in the reference population or reference populations; and
in the classifying step, the classification is based in part on a comparison between at least one principal component of a power spectrum of the sample device and stored reference data pertaining specifically to the same principal component.

15. The method of claim 1, wherein:
the method further comprises calculating at least one statistical parameter of a power spectrum of the sample device, thereby to provide at least one spectral statistical parameter calculation;
the stored reference data include spectral statistical parameter distribution information concerning the statistical distribution, in the reference population or reference populations, of the at least one statistical parameter of a power spectrum of the sample device; and
in the classifying step, the classification is based in part on a comparison between the spectral statistical parameter calculation and the spectral statistical parameter distribution information.

16. The method of claim 1, further comprising:
applying at least one normal stimulus to the sample device, wherein the normal stimulus is an electrical signal applied to an input pin of the device so as to place the device in one or more known functional states;
under the normal stimulus, measuring at least one power spectrum at a selected pin of the sample device, wherein the measured power spectrum represents a response of the sample device to the normal stimulus, and wherein the power spectrum is taken over a multiplicity n of spectral bins;
performing a Principal Component Analysis (PCA) on the normal-stimulus power spectrum, thereby to obtain a normal-stimulus set of principal components of the normal-stimulus power spectrum;
for the normal-stimulus power spectrum, selecting at least one subset from the set of normal-stimulus principal components, wherein the resulting normal-stimulus principal component subset consists of fewer than n of the principal components; and
comparing the normal-stimulus principal component subset to at least part of the stored reference data, whereby the comparison result is based, in part, on the normal-stimulus principal component subset.

17. The method of claim 1, wherein:
the classifying of the sample device relative to reference populations is performed while the sample device is on a wafer among a plurality of similar devices on the wafer;
the method further comprises dicing the wafer;
the placing of the sample device in a batch of devices confirmed for further processing is performed after dicing the wafer; and
the placing of the sample device in a batch for disposal is performed after at least partially dicing the wafer.

18. The method of claim 17, wherein:
the wafer is subdivided into blocks, each containing a plurality of devices;
the sample device is situated in one of the blocks, whereby all other devices in that block are the block neighbors of the sample device;
if the sample device is classified as similar to a reference population of acceptable devices, the sample device and its block neighbors are placed in the batch of devices confirmed for further processing; and
if the sample device is not classified as similar to a reference population of acceptable devices, the sample device and its block neighbors are placed in the batch for disposal.

* * * * *